(12) United States Patent
Miyauchi

(10) Patent No.: US 11,887,787 B2
(45) Date of Patent: Jan. 30, 2024

(54) MULTILAYER CERAMIC ELECTRONIC COMPONENT INCLUDING METAL TERMINALS WITH RECESS PORTIONS AND MOUNTING STRUCTURE OF THE MULTILAYER CERAMIC ELECTRONIC COMPONENT

(71) Applicant: Murata Manufacturing Co., Ltd., Nagaokakyo (JP)

(72) Inventor: Satoshi Miyauchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 97 days.

(21) Appl. No.: 17/405,061

(22) Filed: Aug. 18, 2021

(65) Prior Publication Data

US 2022/0084750 A1    Mar. 17, 2022

(30) Foreign Application Priority Data

Sep. 17, 2020  (JP) ................................. 2020-156321

(51) Int. Cl.
  *H01G 4/232*  (2006.01)
  *H01G 2/06*   (2006.01)
  (Continued)

(52) U.S. Cl.
  CPC ............. *H01G 4/232* (2013.01); *H01G 2/065* (2013.01); *H01G 4/224* (2013.01); *H01G 4/248* (2013.01); *H01G 4/30* (2013.01)

(58) Field of Classification Search
  CPC ........ H01G 4/232; H01G 2/065; H01G 4/224; H01G 4/248; H01G 4/30; H01G 4/40;
  (Continued)

(56) References Cited

U.S. PATENT DOCUMENTS 4,722,470 A * 2/1988 Johary ............... H01R 43/0235
                                                            228/259
5,329,158 A * 7/1994 Lin ....................... H05K 3/3426
                                                            257/772
(Continued)

FOREIGN PATENT DOCUMENTS

JP          56-89239 U     7/1981
JP         11-329893 A    11/1999
(Continued)

*Primary Examiner* — David M Sinclair
*Assistant Examiner* — Daniel M Dubuisson
(74) *Attorney, Agent, or Firm* — Keating & Bennett, LLP

(57) ABSTRACT

A multilayer ceramic electronic component includes a first metal terminal including a first plating film on a surface of a first terminal main body, and a second metal terminal including a second plating film on a surface of the second terminal main body. The first metal terminal includes a surface connected to the first external electrode on which a first recess portion is provided such that the first terminal main body is exposed. The second metal terminal includes a surface connected to the second external electrode on which a second recess portion is provided such that the second terminal main body is exposed. The first and second recess portions each include cavities. An exterior material covers the multilayer ceramic electronic component main body, the bonding material, a portion of the first metal terminal, and a portion of the second metal terminal.

19 Claims, 23 Drawing Sheets

(51) Int. Cl.
  *H01G 4/224* (2006.01)
  *H01G 4/248* (2006.01)
  *H01G 4/30* (2006.01)

(58) Field of Classification Search
  CPC ............... H01G 4/012; H01G 4/38; H05K 2201/10015; H05K 3/3426
  See application file for complete search history.

(56) References Cited

U.S. PATENT DOCUMENTS

| | | | | |
|---|---|---|---|---|
| 2006/0113666 | A1* | 6/2006 | Oonishi | H05K 3/3426 257/735 |
| 2008/0186652 | A1* | 8/2008 | Lee | H01G 4/012 361/306.3 |
| 2011/0102969 | A1* | 5/2011 | Togashi | H01G 4/232 29/25.03 |
| 2014/0055910 | A1* | 2/2014 | Masuda | H01G 4/30 361/303 |
| 2015/0131202 | A1* | 5/2015 | Masuda | H01G 4/30 361/301.4 |
| 2015/0296623 | A1* | 10/2015 | Trinh | H01L 23/498 228/203 |
| 2016/0027594 | A1* | 1/2016 | Ahn | H01G 2/06 361/767 |
| 2017/0169954 | A1* | 6/2017 | Ota | H01G 4/232 |
| 2019/0164694 | A1* | 5/2019 | Ando | H01G 4/12 |
| 2019/0259533 | A1 | 8/2019 | Na | |
| 2019/0304691 | A1* | 10/2019 | Ando | H01G 2/06 |
| 2020/0118743 | A1* | 4/2020 | Byun | H01G 4/30 |
| 2021/0125781 | A1* | 4/2021 | Masuda | H01G 2/06 |
| 2021/0125782 | A1* | 4/2021 | Masuda | H01G 4/232 |

FOREIGN PATENT DOCUMENTS

| | | | | |
|---|---|---|---|---|
| JP | 2008166457 A | * | 7/2008 | ............. H01G 4/242 |
| JP | 2016225417 A | * | 12/2016 | |
| JP | 2019-145767 A | | 8/2019 | |
| KR | 101862705 B1 | * | 5/2018 | |
| WO | WO-2016080350 A1 | * | 5/2016 | ............. H01G 4/228 |

* cited by examiner

FIG. 19

MULTILAYER CERAMIC ELECTRONIC COMPONENT INCLUDING METAL TERMINALS WITH RECESS PORTIONS AND MOUNTING STRUCTURE OF THE MULTILAYER CERAMIC ELECTRONIC COMPONENT

CROSS REFERENCE TO RELATED APPLICATIONS

This application claims the benefit of priority to Japanese Patent Application No. 2020-156321 filed on Sep. 17, 2020. The entire contents of this application are hereby incorporated herein by reference.

BACKGROUND OF THE INVENTION

1. Field of the Invention

The present invention relates to a multilayer ceramic electronic component.

2. Description of the Related Art

Conventionally, a multilayer ceramic electronic component covered with a resin as an exterior material has been known. In such a multilayer ceramic electronic component, metal terminals extending to the outside of the exterior material, and the external electrodes provided on the surface of a main body of the multilayer ceramic electronic component are bonded in the interior of the exterior material by a bonding material including a metal such as solder (refer to Japanese Unexamined Patent Application, Publication No. 2019-145767, for example).

In such a multilayer ceramic electronic component, the bonding material may be melted during reflow at the time of board mounting, such that the volume of the bonding material may expand. Since the volume-expanded bonding material has no place to escape, when the volume of the bonding material expands, the pressure inside the exterior material increases accordingly. As a result, during reflow at the time of board mounting, there is a risk of the bonded portion of the exterior material and the metal terminal peeling off.

SUMMARY OF THE INVENTION

Preferred embodiments of the present invention provide multilayer ceramic electronic components that are each able to reduce or prevent peeling, etc. of a metal terminal during reflow at the time of board mounting.

A preferred embodiment of the present invention provides a multilayer ceramic electronic component including a multilayer ceramic electronic component main body including a multilayer body, a first external electrode, and a second external electrode, the multilayer body including a plurality of laminated dielectric layers and a plurality of laminated internal electrode layers, and further including a first main surface and a second main surface opposed to each other in a height direction, a first side surface and a second side surface opposed to each other in a width direction orthogonal or substantially orthogonal to the height direction, and a first end surface and a second end surface opposed to each other in a length direction orthogonal or substantially orthogonal to the height direction and the width direction, the first external electrode being provided in a vicinity of the first end surface, and the second external electrode being provided in a vicinity of the second end surface, a first metal terminal connected to the first external electrode via a bonding material, and a second metal terminal connected to the second external electrode via a bonding material, wherein the first metal terminal includes a first terminal main body, and a first plating film on a surface of the first terminal main body, the second metal terminal includes a second terminal main body, and a second plating film on a surface of the second terminal main body, the first metal terminal includes a surface connected to the first external electrode on which a first recess portion is provided such that the first terminal main body is exposed, the second metal terminal includes a surface connected to the second external electrode on which a second recess portion is provided such that the second terminal main body is exposed, the first recess portion and the second recess portion each include cavities, and an exterior material covers the multilayer ceramic electronic component main body, the bonding material, a portion of the first metal terminal, and a portion of the second metal terminal.

According to preferred embodiments of the present invention, it is possible to provide multilayer ceramic electronic components that are each able to reduce or prevent peeling, etc. of a metal terminal during reflow at the time of board mounting.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 19 is a cross-sectional view of a multilayer ceramic capacitor of a modified example of the second preferred embodiment of the present invention, and is a diagram corresponding to FIG. 16.

DETAILED DESCRIPTION OF THE PREFERRED EMBODIMENTS

First Preferred Embodiment

Figure 1:
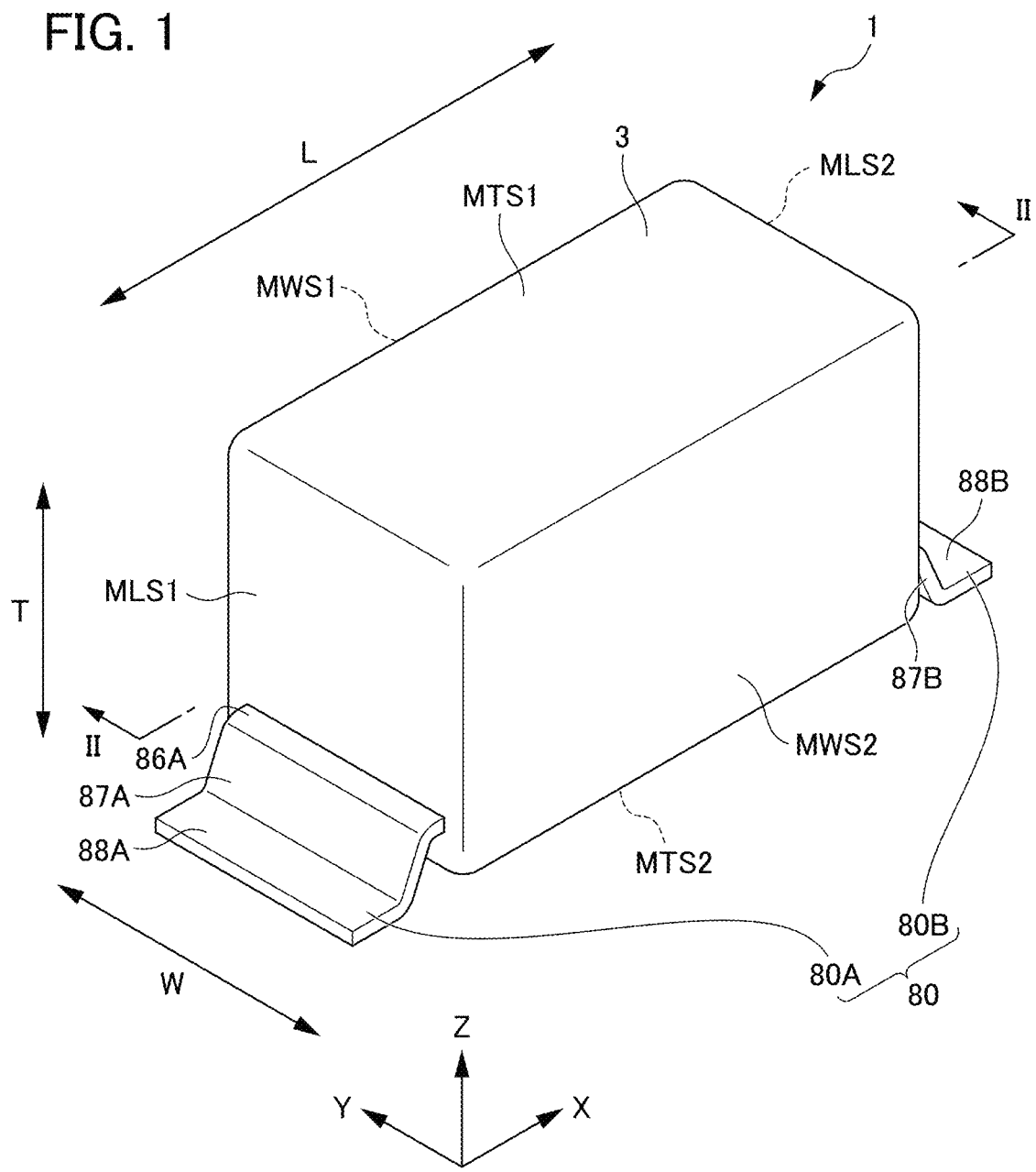
FIG. 1 is an external perspective view of a multilayer ceramic capacitor of a first exemplary preferred embodiment of the present invention.
Figure 2:
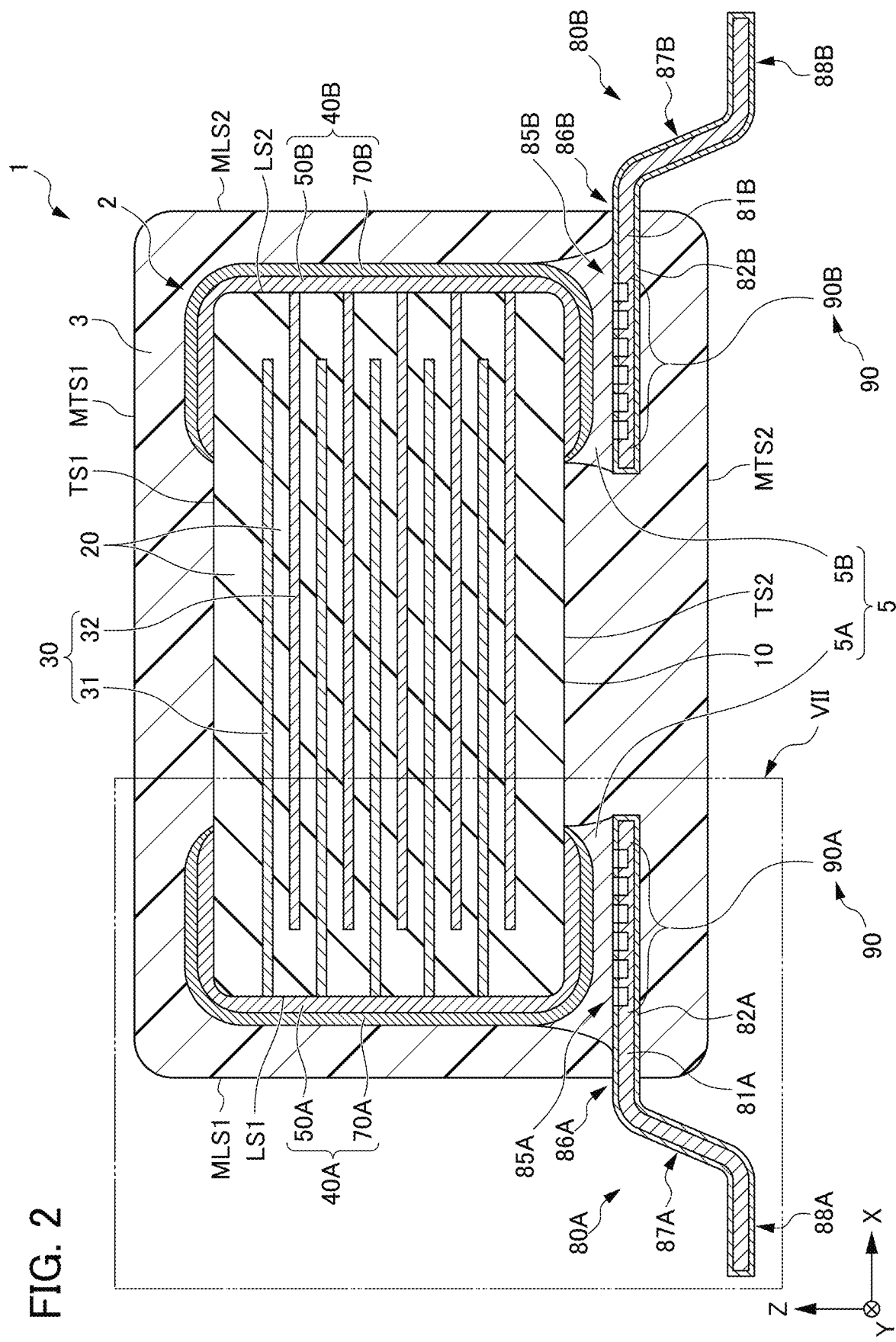
FIG. 2 is a cross-sectional view taken along the line II-II of the multilayer ceramic capacitor of FIG. 1.

Hereinafter, a description will be provided of a multilayer ceramic capacitor 1 as a multilayer ceramic electronic component according to a first exemplary preferred embodiment of the present invention. FIG. 1 is an external perspective view of the multilayer ceramic capacitor 1. FIG. 2 is a cross-sectional view taken along the line II-II of the multilayer ceramic capacitor 1 shown in FIG. 1.

The multilayer ceramic capacitor 1 includes a multilayer ceramic capacitor main body 2 as a multilayer ceramic electronic component body, and metal terminals 80 including recess portions 90. As shown in FIGS. 1 and 2, the multilayer ceramic capacitor main body 2, a bonding material 5 connecting the multilayer ceramic capacitor main body 2 and the metal terminal 80, and a portion of the metal terminal 80 are covered with an exterior material 3.

Figure 3:
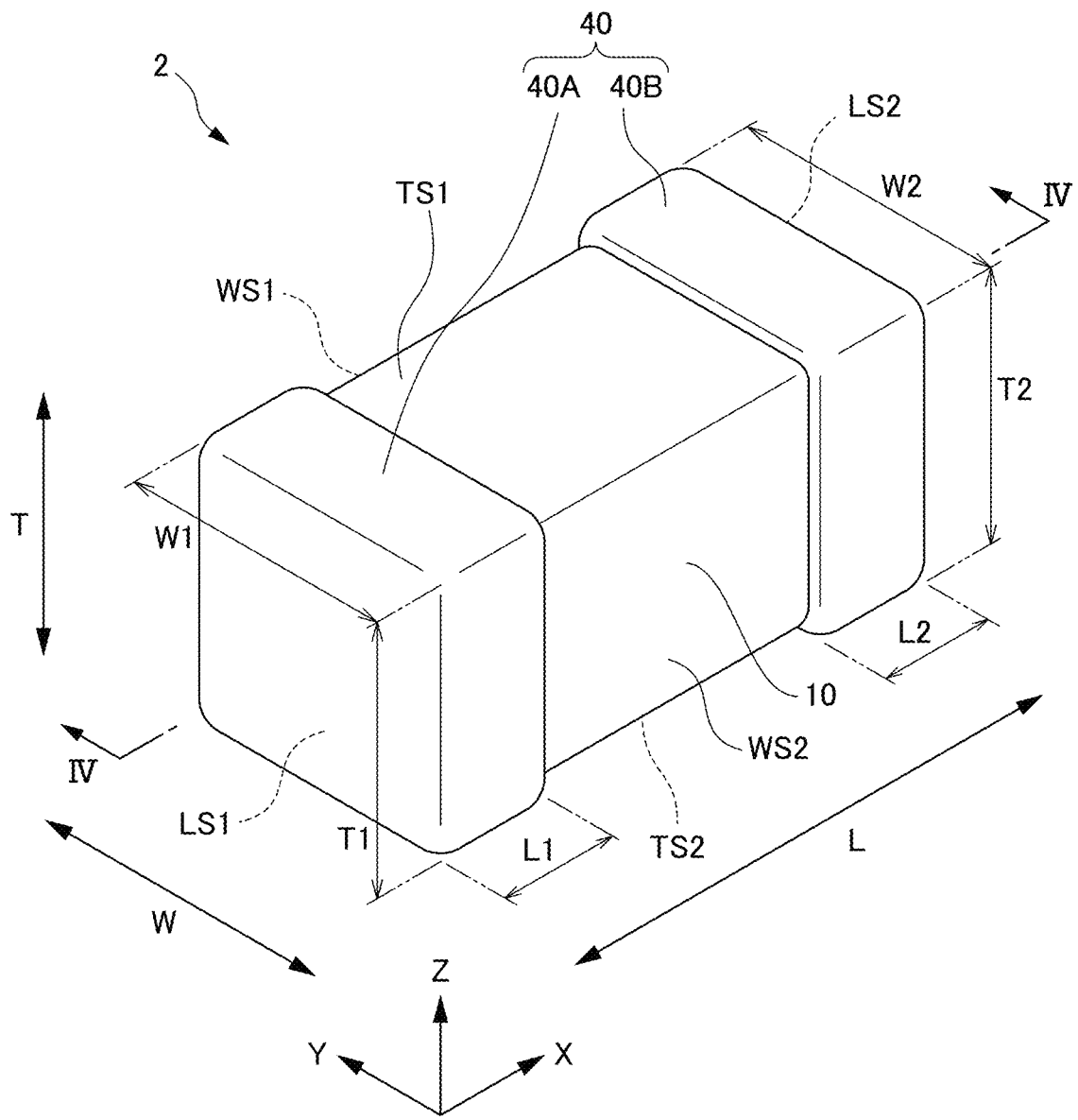
FIG. 3 is an external perspective view showing an external appearance of a multilayer ceramic capacitor main body of the first preferred embodiment of the present invention.
Figure 4:
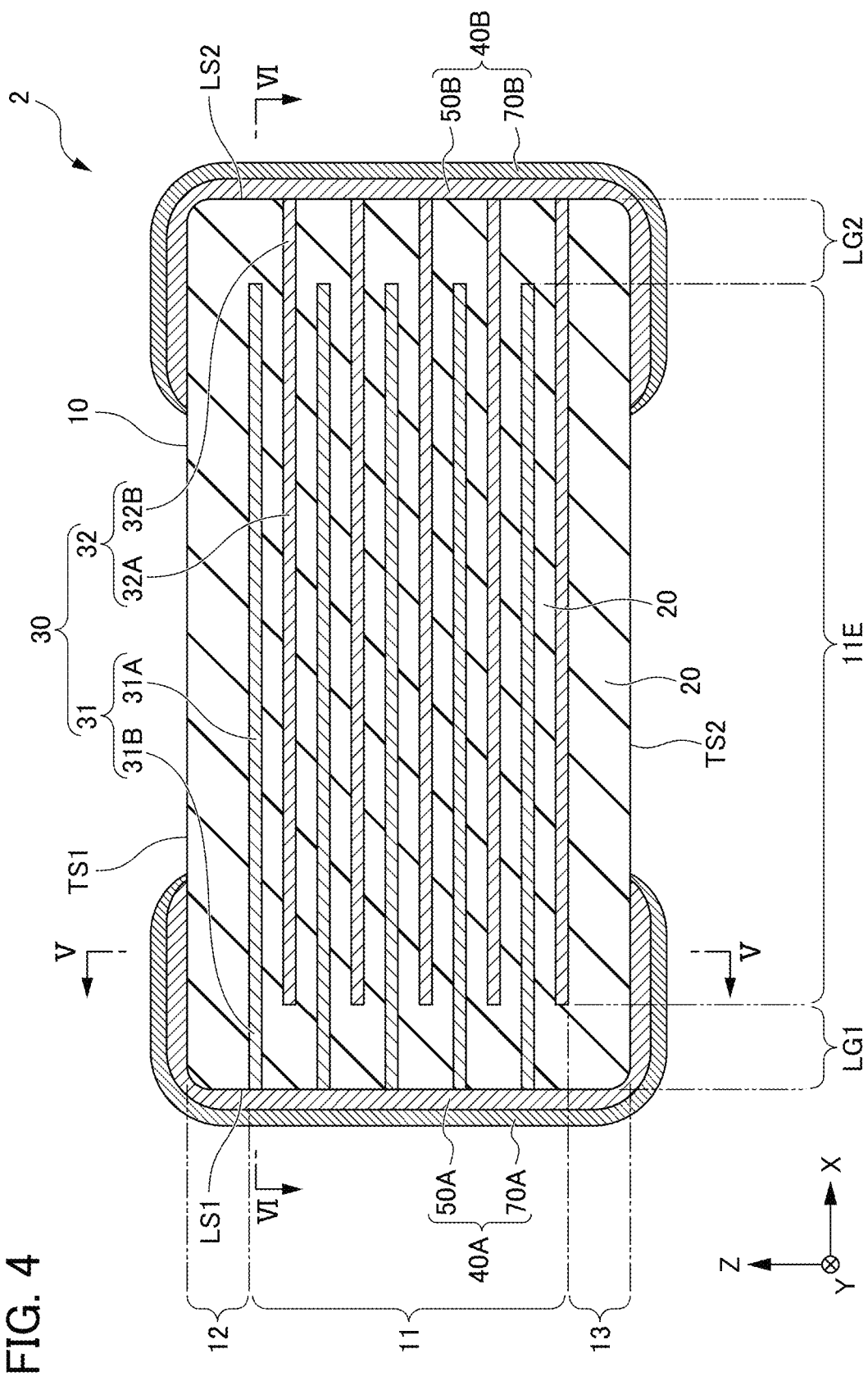
FIG. 4 is a cross-sectional view taken along the line IV-IV of the multilayer ceramic capacitor main body shown in FIG. 3.
Figure 5:
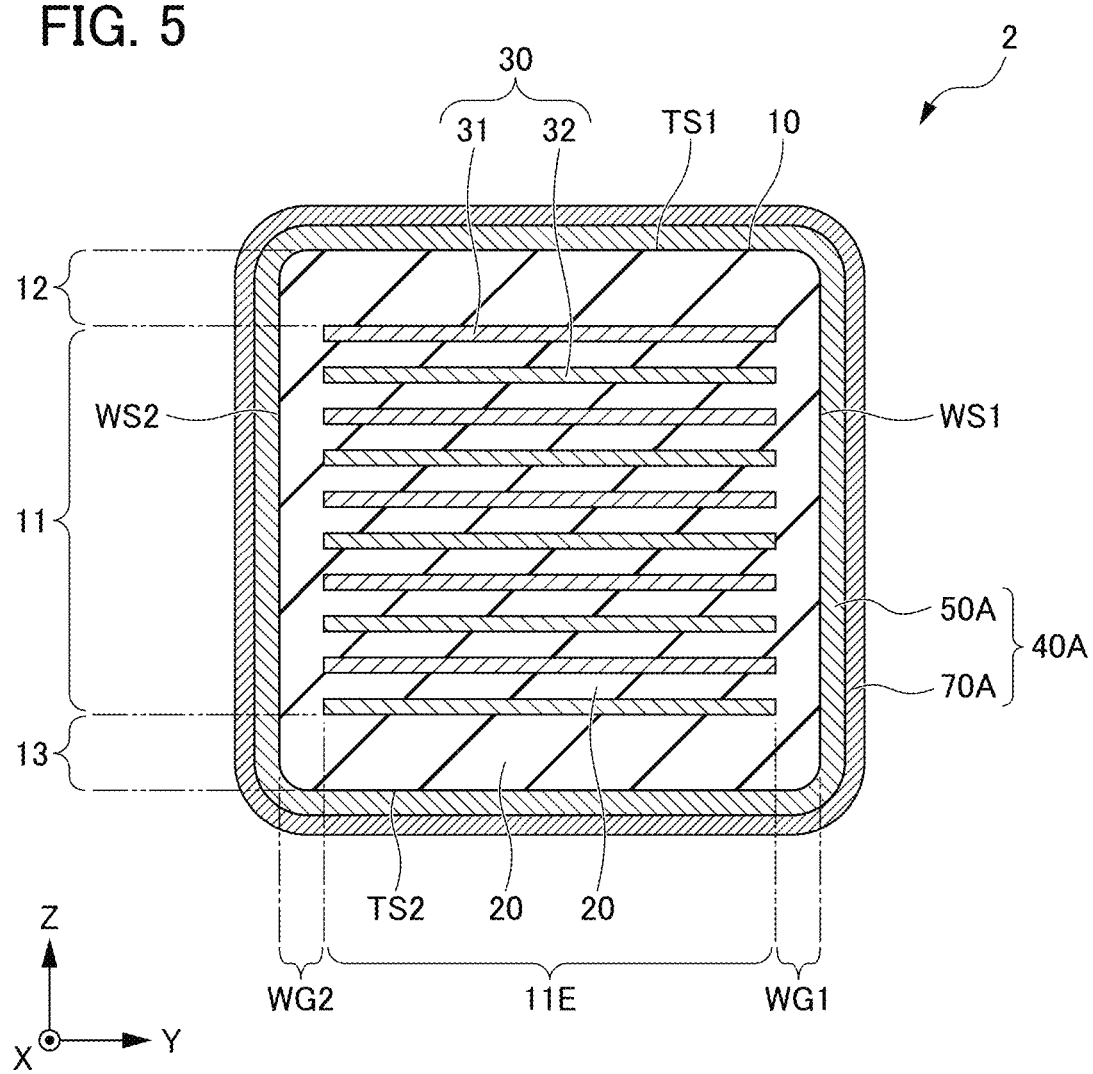
FIG. 5 is a cross-sectional view taken along the line V-V of the multilayer ceramic capacitor main body shown in FIG. 4.
Figure 6:
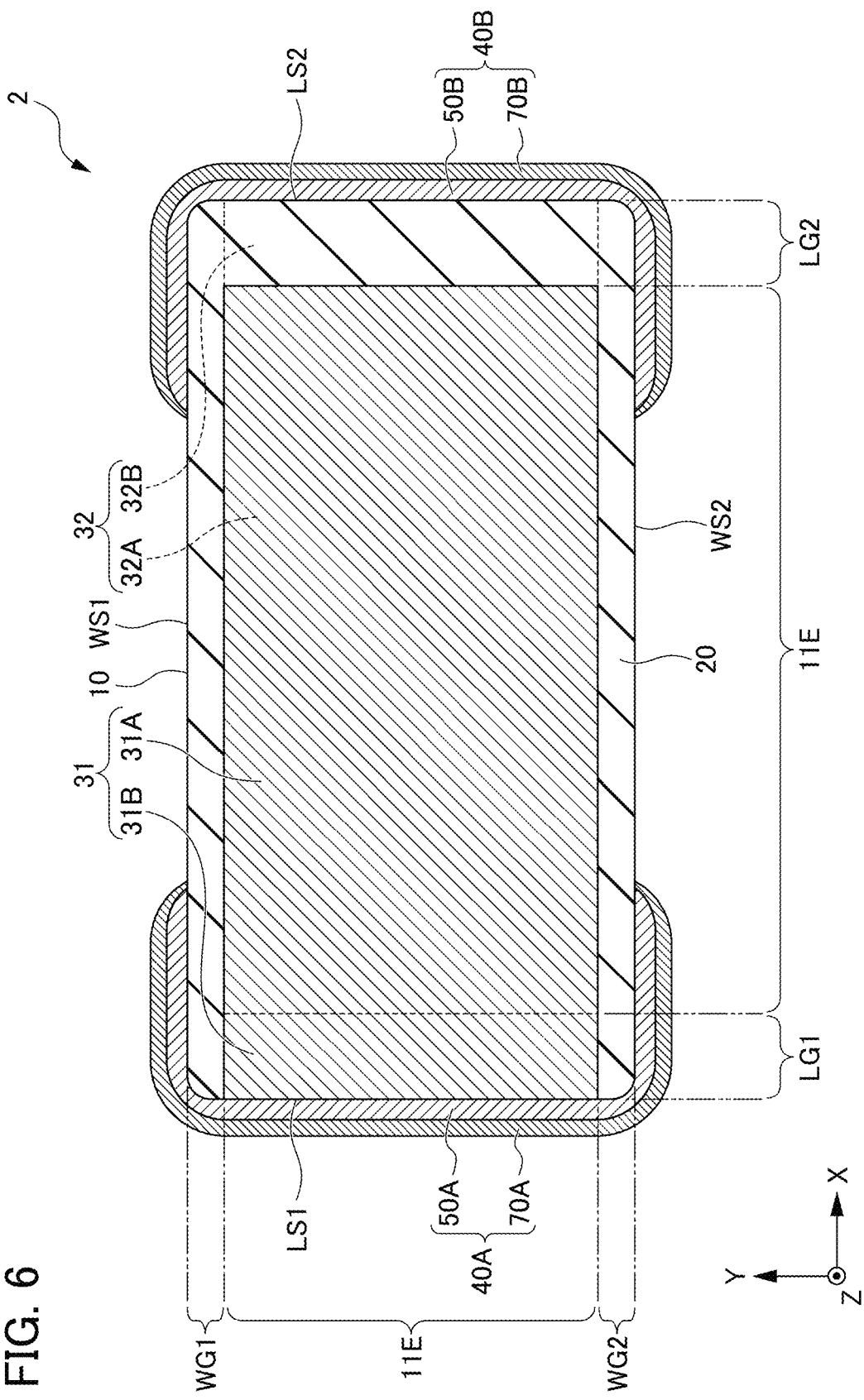
FIG. 6 is a cross-sectional view taken along the line VI-VI of the multilayer ceramic capacitor main body shown in FIG. 4.

With reference to FIGS. 3 to 6, a description will be provided of the multilayer ceramic capacitor main body 2. FIG. 3 is an external perspective view showing an external appearance of the multilayer ceramic capacitor main body 2 before being covered with the exterior material 3 and before the metal terminals 80 are attached. FIG. 4 is a cross-sectional view taken along the line IV-IV of the multilayer ceramic capacitor main body 2 of FIG. 3. FIG. 5 is a cross-sectional view taken along the line V-V of the multilayer ceramic capacitor main body 2 of FIG. 4. FIG. 6 is a cross-sectional view taken along the line VI-VI of the multilayer ceramic capacitor main body 2 of FIG. 4.

The multilayer ceramic capacitor main body 2 includes a multilayer body 10 and external electrodes 40.

FIGS. 3 to 6 each show an XYZ Cartesian coordinate system. The length directions L of the multilayer ceramic capacitor main body 2 and the multilayer body 10 correspond to the X direction. The width directions W of the multilayer ceramic capacitor main body 2 and the multilayer body 10 correspond to the Y direction. The height directions T of the multilayer ceramic capacitor main body 2 and the multilayer body 10 correspond to the Z direction. Here, the cross section shown in FIG. 4 is also referred to as a cross section LT. The cross section shown in FIG. 5 is also referred to as a cross section WT. The cross section shown in FIG. 6 is also referred to as a cross section LW. It should be noted that the same XYZ Cartesian coordinate system is shown in FIG. 1, FIG. 2, and FIGS. 7 to 19.

As shown in FIGS. 3 to 6, the multilayer body 10 includes a first main surface TS1 and a second main surface TS2 opposed to each in the height direction T, a first side surface WS1 and a second side surface WS2 opposed to each other in the width direction W orthogonal or substantially orthogonal to the height direction T, and a first end surface LS1 and a second end surface LS2 opposed to each other in the length direction L orthogonal or substantially orthogonal to the height direction T and the width direction W.

As shown in FIG. 3, the multilayer body 10 includes a rectangular or substantially rectangular shape. It should be noted that the dimension of the multilayer body 10 in the length direction L is not necessarily longer than the dimension of the width direction W. It is preferable that the multilayer body 10 includes rounded corner portions and rounded ridge portions. The corner portions are portions where the three surfaces of the multilayer body intersect, and the ridge portions are portions where the two surfaces of the multilayer body intersect. It should be noted that unevenness or the like may be provided on a portion or the entirety of the surface of the multilayer body 10.

The dimension of the multilayer body 10 is not particularly limited. However, when the dimension in the length direction L of the multilayer body 10 is defined as L, L is preferably about 0.2 mm or more and about 10 mm or less, for example. When the dimension in the height direction T of the multilayer body 10 is defined as T, T is preferably about 0.1 mm or more and about 10 mm or less, for example. Furthermore, when the dimension in the width direction W of the multilayer body 10 is defined as W, W is preferably about 0.1 mm or more and about 10 mm or less, for example.

As shown in FIGS. 4 and 5, the multilayer body 10 includes an inner layer portion 11, and a first main surface-side outer layer portion 12 and a second main surface-side outer layer portion 13 sandwiching the inner layer portion 11 in the height direction T.

The inner layer portion 11 includes dielectric layers 20 as a plurality of ceramic layers, and internal electrode layers 30 as a plurality of inner conductive layers. The inner layer portion 11 includes, in the height direction T, from the internal electrode layer 30 located closest to the first main surface TS1 to the internal electrode layer 30 located closest to the second main surface TS2. In the inner layer portion 11, the plurality of internal electrode layers 30 are opposed to each other with the dielectric layer 20 interposed therebetween. The inner layer portion 11 generates a capacitance and thus defines and functions as a capacitor.

The plurality of dielectric layers 20 are made of a dielectric material. For example, the dielectric material may be a dielectric ceramic containing a component such as $BaTiO_3$, $CaTiO_3$, $SrTiO_3$, or $CaZrO_3$. Furthermore, the dielectric material may be obtained by adding a second component such as, for example, a Mn compound, an Fe compound, a Cr compound, a Co compound, or a Ni compound to the main component.

The dielectric layers 20 each preferably have a thickness of about 0.5 µm or more and about 72 µm or less, for example. The number of the dielectric layers 20 to be stacked (laminated) is preferably ten or more and 700 or less, for example. The number of the dielectric layers 20 refers to the total number of dielectric layers in the inner layer portion 11, and dielectric layers in the first main surface-side outer layer portion 12 and the second main surface-side outer layer portion 13.

The plurality of internal electrode layers 30 include a plurality of first internal electrode layers 31 and a plurality of second internal electrode layers 32. The plurality of first internal electrode layers 31 are provided on the plurality of dielectric layers 20. The plurality of second internal electrode layers 32 are provided on the plurality of dielectric layers 20. The plurality of first internal electrode layers 31 and the plurality of second internal electrode layers 32 are embedded so as to be alternately provided in the height direction T of the multilayer body 10.

The first internal electrode layer 31 includes a first opposing portion 31A facing the second internal electrode layer 32, and a first lead-out portion 31B extending from the first opposing portion 31A to the first end surface LS1. The first lead-out portion 31B is exposed at the first end surface LS1.

The second internal electrode layer 32 includes a second opposing portion 32A facing the first internal electrode layer 31, and a second lead-out portion 32B extending from the second opposing portion 32A to the second end surface LS2. The second lead-out portion 32B is exposed at the second end surface LS2.

In the present preferred embodiment, the first opposing portion 31A and the second opposing portion 32A are opposed to each other with the dielectric layers 20 interposed therebetween, such that a capacitance is generated, and thus, the characteristics of a capacitor are provided.

The shapes of the first opposing portion 31A and the second opposing portion 32A are not particularly limited, but are preferably rectangular or substantially rectangular, for example. However, the corner portions of the rectangular or substantially rectangular shape may be rounded, or the corner portions of the rectangular or substantially rectangular shape may be oblique. The shapes of the first lead-out portion 31B and the second lead-out portion 32B are not particularly limited, but are preferably rectangular or substantially rectangular. However, the corner portions of the rectangular or substantially rectangular shape may be rounded, or the corner portions of the rectangular or substantially rectangular shape may be oblique.

The dimension in the width direction W of the first opposing portion 31A and the dimension in the width direction W of the first lead-out portion 31B may be the same or substantially the same dimensions, or one of them may have a smaller dimension. The dimension in the width direction W of the second opposing portion 32A and the dimension in the width direction W of the second lead-out portion 32B may be the same or substantially the same dimensions, or one of them may have a narrower dimension.

The first internal electrode layer 31 and the second internal electrode layer 32 are each made of a metal such as, for example, Ni, Cu, Ag, Pd, or Au, or a suitable conductive material such as an alloy including at least one of these metals. In a case in which an alloy is used, the first internal electrode layer 31 and the second internal electrode layer 32 may be made of, for example, a Ag—Pd alloy.

The thickness of each of the first internal electrode layer 31 and the second internal electrode layer 32 is preferably, for example, about 0.2 µm or more and 3.0 µm or less. The total number of the first internal electrode layers 31 and the second internal electrode layers 32 is preferably five or more and 350 or less, for example.

The first main surface-side outer layer portion 12 is located in a vicinity of the first main surface TS1 of the multilayer body 10. The first main surface-side outer layer portion 12 includes a plurality of dielectric layers 20 as ceramic layers positioned between the first main surface TS1 and the internal electrode layer 30 closest to the first main surface TS1. The dielectric layer 20 in the first main surface-side outer layer portion 12 may be the same as the dielectric layer 20 in the inner layer portion 11.

The second main surface-side outer layer portion 13 is located in a vicinity of the second main surface TS2 of the multilayer body 10. The second main surface-side outer layer portion 13 includes a plurality of dielectric layers 20 as ceramic layers positioned between the second main surface TS2 and the internal electrode layer 30 closest to the second main surface TS2. The dielectric layer 20 in the second main surface-side outer layer portion 13 may be the same as the dielectric layer 20 in the inner layer portion 11.

The multilayer body 10 includes a counter electrode portion 11E. The counter electrode portion 11E is a portion where the first opposing portion 31A of the first internal electrode layer 31 and the second opposing portion 32A of the second internal electrode layer 32 are opposite to each other. The counter electrode portion 11E is a portion of the inner layer portion 11. FIG. 4 illustrates a range in the length direction L of the counter electrode portion 11E. FIG. 5 illustrates a range in the width direction W of the counter electrode portion 11E. FIG. 6 shows the ranges in the width direction W and the length direction L of the counter electrode portion 11E. The counter electrode portion 11E is also referred to as a capacitor effective portion.

The multilayer body 10 includes a side surface-side outer layer portion WG. The side surface-side outer layer portion WG includes a first side surface-side outer layer portion WG1 and a second side surface-side outer layer portion WG2. The first side surface-side outer layer portion WG1 is a portion including a dielectric layer 20 located between the counter electrode portion 11E and the first side surface WS1. The second side surface-side outer layer portion WG2 is a portion including a dielectric layer 20 located between the counter electrode portion 11E and the second side surface WS2. FIGS. 5 and 6 each show the ranges in the width direction W of the first side surface-side outer layer portion WG1 and the second side surface-side outer layer portion WG2. The side surface-side outer layer portion WG is also referred to as W gap or side gap.

Furthermore, the multilayer body 10 includes an end surface-side outer layer portion LG. The end surface-side outer layer portion LG includes a first end surface-side outer layer portion LG1 and a second end surface-side outer layer portion LG2. The first end surface-side outer layer portion LG1 is a portion including a dielectric layer 20 located between the counter electrode portion 11E and the first end surface LS1. The second end surface-side outer layer portion LG2 is a portion including a dielectric layer 20 located between the counter electrode portion 11E and the second end surface LS2. FIGS. 4 and 6 each show the ranges in the length directions L of the first end surface-side outer layer portion LG1 and the second end surface-side outer layer portion LG2. The end surface-side outer layer portion LG is also referred to as L gap or end gap.

The external electrodes 40 include a first external electrode 40A and a second external electrode 40B.

The first external electrode 40A is provided in a vicinity of the first end surface LS1. The first external electrode 40A is connected to the first internal electrode layer 31. The first external electrode 40A is provided on the first end surface LS1. However, it may be provided on at least one of the first main surface TS1, the second main surface TS2, the first side surface WS1, and the second side surface WS2, in addition to the first end surface LS1. In the present preferred embodiment, the first external electrode 40A is provided on a portion of the first main surface TS1, a portion of the second main surface TS2, a portion of the first side surface WS1, and a portion of the second side surface WS2, in addition to the first end surface LS1. The first external electrode 40A may be provided, for example, either from the first end surface LS1 to the first main surface TS1 or from the first end surface LS1 to the second main surface TS2. In other words, the cross-sectional shape of the first external electrode 40A may be L-shaped (not shown). The first external electrode 40A is provided at least on a surface facing a first metal terminal 80A to be described later.

When the first external electrode 40A is provided on at least one of the first main surface TS1, the second main surface TS2, the first side surface WS1, and the second side surface WS2, it is preferable that the length L1 in the length direction L of the first external electrode 40A on the provided surface is, for example, about 20% or more and about 40% or less (e.g., 40 μm or more and 4000 μm or less) of the dimension L of the multilayer body.

When the first external electrode 40A is provided on at least one of the first main surface TS1 or the second main surface TS2, it is preferable that the length W1 in the width direction W of the first external electrode 40A on the provided surface is equal or substantially equal to the dimension W of the multilayer body 10 (for example, about 0.1 mm or more and about 10 mm or less). When the first external electrode 40A is provided on at least one of the first side surface WS1 or the second side surface WS2, it is preferable that the length T1 in the height direction T of the first external electrode 40A on the provided surface is equal or substantially equal to the dimension T of the multilayer body 10 (for example, about 0.1 mm or more and about 10 mm or less).

The second external electrode 40B is provided in a vicinity of the second end surface LS2. The second external electrode 40B is connected to the second internal electrode layer 32. The second external electrode 40B is provided on the second end surface LS2. However, it may be provided on at least one of the first main surface TS1, the second main surface TS2, the first side surface WS1, and the second side surface WS2, in addition to the second end surface LS2. In the present preferred embodiment, the second external electrode 40B is provided on a portion of the first main surface TS1, a portion of the second main surface TS2, a portion of the first side surface WS1, and a portion of the second side surface WS2, in addition to the second end surface LS2. The second external electrodes 40B may be provided, for example, either from the second end surface LS2 to the first main surface TS1 or from the second end surface LS2 to the second main surface TS2. In other words, the cross-sectional shape of the second external electrode 40B may be L-shaped (not shown). The second external electrode 40B is provided at least on a surface facing a second metal terminal 80B to be described later.

When the second external electrode 40B is provided on at least one of the first main surface TS1, the second main surface TS2, the first side surface WS1, and the second side surface WS2, it is preferable that the length L1 in the length direction L of the second external electrode 40B on the provided surface is about 20% or more and about 40% or less (for example, about 40 μm or more and about 4000 μm or less) of the dimension L of the multilayer body.

When the second external electrode 40B is provided on at least one of the first main surface TS1 or the second main surface TS2, it is preferable that the length W2 in the width direction W of the second external electrode 40B on the provided surface is equal or substantially equal to the dimension W of the multilayer body 10 (for example, about 0.1 mm or more and about 10 mm or less). When the second external electrode 40B is provided on at least one of the first side surface WS1 or the second side surface WS2, it is preferable that the length T2 in the height direction T of the second external electrode 40B on the provided surface is equal or substantially equal to the dimension T of the multilayer body 10 (for example, about 0.1 mm or more and about 10 mm or less).

As described above, in the multilayer body 10, the capacitance is generated by the first opposing portions 31A of the first internal electrode layers 31 and the second opposing portions 32A of the second internal electrode layers 32 opposing each other with the dielectric layers 20 interposed therebetween. Therefore, characteristics of the capacitor are provided between the first external electrode 40A to which the first internal electrode layers 31 are connected and the second external electrode 40B to which the second internal electrode layers 32 are connected.

The first external electrode 40A includes a first base electrode layer 50A and a first plated layer 70A provided on the first base electrode layer 50A.

The second external electrode 40B includes a second base electrode layer 50B and a second plated layer 70B provided on the second base electrode layer 50B.

The first base electrode layer 50A is provided on the first end surface LS1. The first base electrode layer 50A is connected to the first internal electrode layer 31. In the present preferred embodiment, the first base electrode layer 50A extends from the first end surface LS1 to a portion of the first main surface TS1, to a portion of the second main surface TS2, to a portion of the first side surface WS1, and to a portion of the second side surface WS2.

The second base electrode layer 50B is provided on the second end surface LS2. The second base electrode layer 50B is connected to the second internal electrode layer 32. In the present preferred embodiment, the second base electrode layer 50B extends from the second end surface LS2 to a portion of the first main surface TS1, to a portion of the second main surface TS2, to a portion of the first side surface WS1, and to a portion of the second side surface WS2.

In the present preferred embodiment, the first base electrode layer 50A and the second base electrode layer 50B are each a fired layer. It is preferable that the fired layer include a metal component and either a glass component or a ceramic component, or alternatively, a metal component and both of a glass component and a ceramic component. The metal component includes, for example, at least one selected from Cu, Ni, Ag, Pd, Ag—Pd alloys, and Au. The glass component includes, for example, at least one selected from B, Si, Ba, Mg, Al, and Li. As the ceramic component, a ceramic material of the same kind as that of the dielectric layer 20 may be used, or a ceramic material of a different kind may be used. The ceramic component includes, for example, at least one selected from $BaTiO_3$, $CaTiO_3$, $(Ba, Ca)TiO_3$, $SrTiO_3$, and $CaZrO_3$.

The fired layer is obtained by applying a conductive paste including glass and metal to the multilayer body, and firing. The fired layer may be obtained by simultaneously firing a laminated (multilayer) chip including the internal electrode layers and the dielectric layers, and a conductive paste applied to the laminated chip, or alternatively may be obtained by firing the laminated chip including the internal electrode layers and the dielectric layers to obtain a multilayer body, followed by the conductive paste being applied to the multilayer body and firing being performed. In a case in which the laminated chip including the internal electrode layers and the dielectric layers, and the conductive paste applied to the laminated chip are fired simultaneously, it is preferable that the firing layer is formed by firing a material to which a ceramic material is added, instead of the glass component. In this case, it is particularly preferable to use the same type of ceramic material as the dielectric layer 20 as the ceramic material to be added. Furthermore, the fired layer may include a plurality of layers.

The thickness in the length direction of the first base electrode layer 50A located on the first end surface LS1 is preferably, for example, about 10 μm or more and about 200 μm or less in the central portion in the height direction T and the width direction W of the first base electrode layer 50A.

The thickness in the length direction of the second base electrode layer 50B located on the second end surface LS2 is preferably, for example, about 10 μm or more and about 200 μm or less in the central portion in the height direction T and the width direction W of the second base electrode layer 50B.

When the first base electrode layer 50A is provided on a portion of the surface of at least the first main surface TS1 or the second main surface TS2, it is preferable that the thickness in the height direction of the first base electrode layer 50A on the provided surface is, for example, about 5 μm or more and about 40 μm or less at the central portion in the length direction L and the width direction W of the first base electrode layer 50A on the provided surface.

When the first base electrode layer 50A is provided on a portion of the surface of at least the first side surface WS1 or the second side surface WS2, it is preferable that the thickness in the width direction of the first base electrode layer 50A on the provided surface is, for example, about 5 μm or more and about 40 μm or less at the central portion in the length direction L and the height direction T of the first base electrode layer 50A on the provided surface.

When the second base electrode layer 50B is provided on a portion of the surface of at least the first main surface TS1 or the second main surface TS2, it is preferable that the thickness in the height direction of the second base electrode layer 50B on the provided surface is, for example, about 5 μm or more and about 40 μm or less at the central portion in the length direction L and the width direction W of the second base electrode layer 50B on the provided surface.

When the second base electrode layer 50B is provided on a portion of the surface of at least the first side surface WS1 or the second side surface WS2, it is preferable that the thickness in the width direction of the second base electrode layer 50B on the provided surface is, for example, about 5 μm or more and about 40 μm or less at the central portion in the length direction L and the height direction T of the second base electrode layer 50B on the provided surface.

The first plated layer 70A and the second plated layer 70B described later may be directly provided on the multilayer body 10 without providing the first base electrode layer 50A and the second base electrode layer 50B.

The first base electrode layer 50A and the second base electrode layer 50B are not limited to the fired layer, and each may be, for example, a thin film layer. The thin film layer is a layer in which metal particles are deposited, and which is formed by a thin film forming method such as, for example, a sputtering method or a deposition method. The thin film layer preferably includes, for example, at least one metal selected from the group consisting of Mg, Al, Ti, W, Cr, Cu, Ni, Ag, Co, Mo, and V. Thus, it is possible to increase the adhesion force of the external electrodes 40 to the multilayer body 10. The thin film layer may be a single layer or may include a plurality of layers. For example, the thin film layer may include a two-layer structure including a layer of NiCr and a layer of NiCu.

When the thin film layer as a base electrode is formed by a sputtering electrode by a sputtering method, the sputtering electrode is preferably formed on a portion of the first main surface TS1 and on a portion of the second main surface TS2 of the multilayer body 10. The sputtering electrode preferably includes at least one metal selected from Ni, Cr, and Cu, for example. The thickness of the sputtering electrode is preferably about 50 nm or more and about 400 nm or less, and more preferably about 50 nm or more and about 130 nm or less, for example.

As the base electrode layer, for example, a sputtering electrode may be provided on a portion of the first main surface TS1 and on a portion of the second main surface TS2 of the multilayer body 10, while a fired layer may be provided on the first end surface LS1 and the second end surface LS2.

Alternatively, the base electrode layer may not be provided on the first end surface LS1 and the second end surface LS2, and a plated layer, which will be described later, may be provided directly on the multilayer body 10, for example. It should be noted that, when a fired layer is provided on the first end surface LS1 and the second end surface LS2, the fired layer may be provided not only on the first end surface LS1 and the second end surface LS2, but also on a portion of the first main surface TS1 and on a portion of the second main surface TS2. In this case, the sputtering electrode may overlap the fired layer.

The first plated layer 70A covers the first base electrode layer 50A.

The second plated layer 70B covers the second base electrode layer 50B.

The first plated layer 70A and the second plated layer 70B may include at least one selected from Cu, Ni, Sn, Ag, Pd, Ag—Pd alloy, and Au, for example. Each of the first plated layer 70A and the second plated layer 70B may include a plurality of layers.

The first plated layer 70A and the second plated layer 70B are preferably a two-layer structure including a Sn-plated layer provided on the Ni-plated layer. In this case, the Ni-plated layer prevents the first base electrode layer 50A and the second base electrode layer 50B from being eroded by solder as a bonding material 5 to bond the multilayer ceramic capacitor main body 2 and the metal terminal 80. Furthermore, the Sn-plated layer improves the wettability of the solder as the bonding material 5 to bond the multilayer ceramic capacitor main body 2 and the metal terminal 80. This facilitates the bonding of the multilayer ceramic capacitor main body 2 and the metal terminal 80. When each of the first plated layer 70A and the second plated layer 70B is the two-layer structure including the Ni-plated layer and the Sn-plated layer, the thickness of each of the Ni-plated layer and the Sn-plated layer is preferably about 1 μm or more and about 15 μm or less, for example.

It should be noted that the first external electrode 40A and the second external electrode 40B of the present preferred embodiment may each include a conductive resin layer including, for example, conductive particles and a thermosetting resin. It is preferable that such a conductive resin layer is provided between the first base electrode layer 50A and the first plated layer 70A in the first external electrode 40A, and provided between the second base electrode layer 50B and the second plated layer 70B in the second external electrode 40B. The conductive resin layer including a thermosetting resin is more flexible than a conductive layer made of, for example, a plating film or a fired product of a conductive paste. Therefore, even when an impact caused by physical shock or thermal cycle to the multilayer ceramic capacitor 1 is applied, the conductive resin layer defines and functions as a buffer layer, such that crack generation of the multilayer ceramic capacitor 1 is reduced or prevented.

The external electrode 40 may be provided only with a plated layer without providing the first base electrode layer 50A or the second base electrode layer 50B. In such a case, the plated layer may be provided after the catalyst is provided on the surface of the multilayer body 10 as a pretreatment. In this case as well, the plated layer preferably includes a plurality of layers and, similarly to the configuration described above, the two-layer structure is preferably provided in which the Sn-plated layer as an upper plated layer is provided on the Ni-plated layer as a lower plated layer. Furthermore, for example, when the first internal electrode layer 31 and the second internal electrode layer 32 are made of Ni, it is preferable that the lower plated layer is made of Cu having a favorable bonding property with Ni. The plated layer preferably does not include glass. The metal ratio per unit volume of the plated layer is preferably about 99% by volume or more, for example.

When the dimension in the length direction of the multilayer ceramic capacitor main body 2 including the multilayer body 10 and the external electrode 40 is defined as L, the dimension L is preferably about 0.2 mm or more and about 10 mm or less, for example. In addition, when the dimension in the lamination direction of the multilayer ceramic capacitor 1 is defined as T, the dimension T is preferably about 0.1 mm or more and about 10 mm or less, for example. Furthermore, the dimension in the width direction of the multilayer ceramic capacitor main body 2 is defined as W. The dimension W is preferably about 0.1 mm or more and about 10 mm or less, for example.

Returning to FIGS. 1 and 2, the metal terminal 80 includes a first metal terminal 80A, and a second metal terminal 80B. The recess portions 90 provided in the metal terminal 80 include first recess portions 90A provided in the first metal terminal 80A, and second recess portions 90B provided in the second metal terminal 80B. The bonding materials 5 include a first bonding material 5A and a second bonding material 5B. The first metal terminal 80A is connected to the first external electrode 40A via the first bonding material 5A. The second metal terminal 80B is connected to the second external electrode 40B via the second bonding material 5B.

Figure 21:
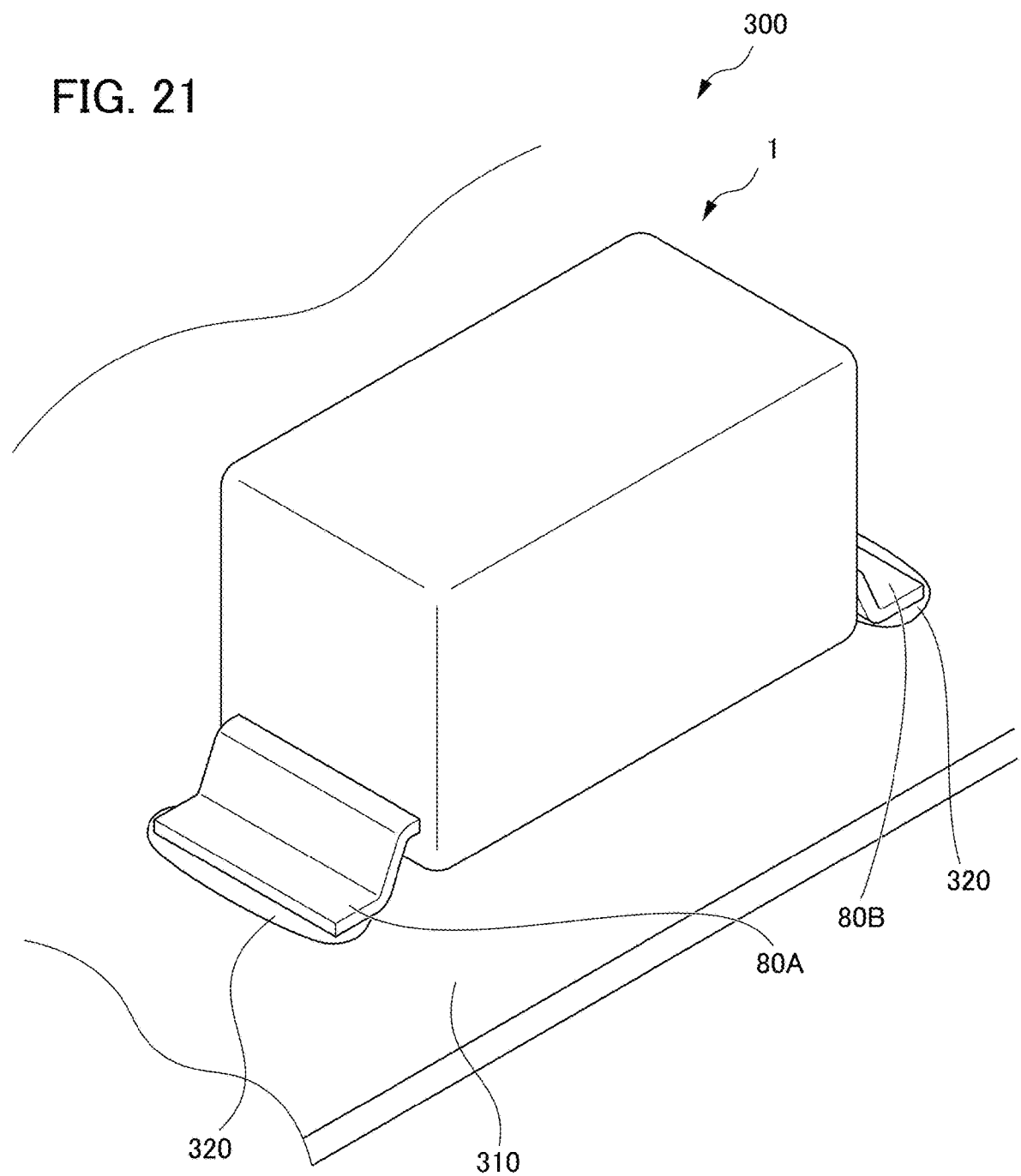
FIG. 21 is a diagram showing a mounting structure of a multilayer ceramic electronic component of a preferred embodiment of the present invention.

The first metal terminal 80A and the second metal terminal 80B are each a terminal for surface-mounting the multilayer ceramic capacitor main body 2 on the mounting board (refer to a mounting board 310 in FIG. 21). The first metal terminal 80A and the second metal terminal 80B are each a plate-shaped lead frame, for example.

The first metal terminal 80A includes a first bonding portion 85A facing the first main surface TS1 or the second main surface TS2, or the first side surface WS1 or the second side surface WS2 on which the first external electrode 40A is provided, a first extending portion 86A connected to the first bonding portion 85A and extending away from the multilayer ceramic capacitor main body 2 in a direction parallel or substantially parallel to the first main surface TS1 or the second main surface TS2, or the first side surface WS1 or the second side surface WS2 facing the first bonding portion 85A, a second extending portion 87A connected to the first extending portion 86A and extending toward a mounting surface to provide a gap between the first main surface TS1 or the second main surface TS2, or the first side surface WS1 or the second side surface WS2 facing the first bonding portion 85A, and the mounting surface on which the multilayer ceramic capacitor 1 is to be mounted, and a first mounting portion 88A connected to the second extending portion 87A and extending parallel or substantially parallel to the mounting surface. In the present preferred embodiment, the surface of the multilayer body 10 facing the first bonding portion 85A corresponds to the second main surface TS2.

The second metal terminal 80B includes a second bonding portion 85B facing the first main surface TS1 or the second main surface TS2, or the first side surface WS1 or the second side surface WS2 on which the second external electrode 40B is provided, a third extending portion 86B connected to the second bonding portion 85B and extending away from the multilayer ceramic capacitor main body 2 in a direction parallel or substantially parallel to the first main surface TS1 or the second main surface TS2, or the first side surface WS1 or the second side surface WS2 facing the second bonding portion 85B, a fourth extending portion 87B connected to the third extending portion 86B, and extending toward a mounting surface to provide a gap between the first main surface TS1 or the second main surface TS2, or the first side surface WS1 or the second side surface WS2 facing the second bonding portion 85B, and the mounting surface of a mounting board on which the multilayer ceramic capacitor 1 is to be mounted, and a second mounting portion 88B connected to the fourth extending portion 87B and extending parallel or substantially parallel to the mounting surface. In the present preferred embodiment, the surface of the multilayer body 10 facing the second bonding portion 85B corresponds to the second main surface TS2.

Figure 7:
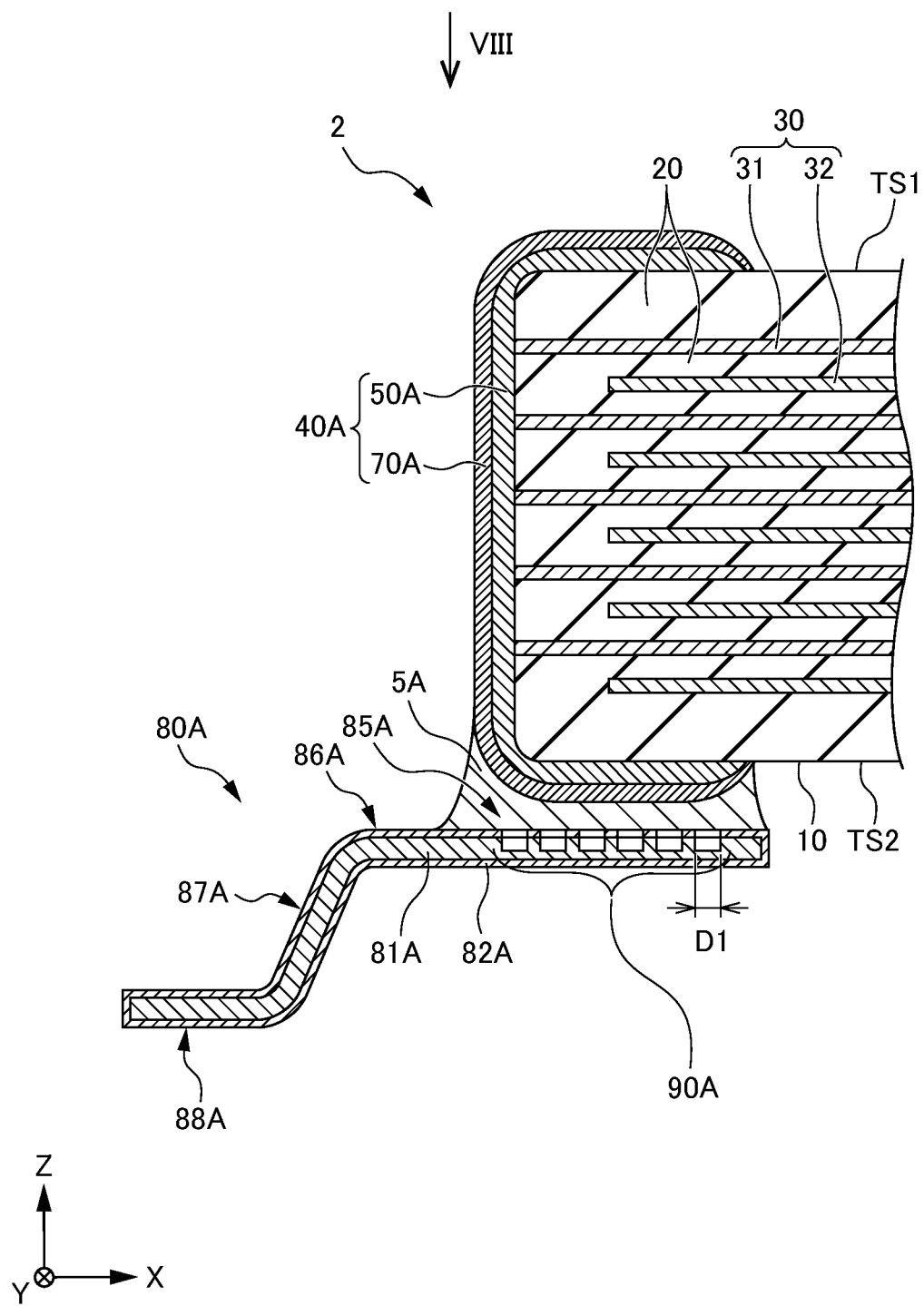
FIG. 7 is an enlarged view of the VII portion of the multilayer ceramic capacitor shown in FIG. 2.

FIG. 7 is an enlarged view of the VII portion of the multilayer ceramic capacitor 1 shown in FIG. 2, and is a diagram for explaining a connecting portion between the first external electrode 40A and the first metal terminal 80A. In FIG. 7, the exterior material 3 is not shown. As shown in FIGS. 2 and 7, the first metal terminal 80A includes a first terminal main body 81A, and a first plating film 82A provided on the surface of the first terminal main body 81A. The first recess portion 90A is provided on a surface of the first metal terminal 80A connected to the first external electrode 40A so that the first terminal main body 81A is exposed.

As shown in FIG. 2, the second metal terminal 80B includes a second terminal main body 81B, and a second plating film 82B provided on the surface of the second terminal main body 81B. The second recess portion 90B is provided on a surface of the second metal terminal 80B connected to the second external electrode 40B so that the second terminal main body 81B is exposed. The first metal terminal 80A and the second metal terminal 80B are substantially plane symmetrical to each other with respect to the cross section WT in the middle in the length direction L of the multilayer ceramic capacitor 1.

The first terminal main body 81A and the second terminal main body 81B preferably include, for example, Ni, Fe, Cu, Ag, Cr, or an alloy including one or more of these metals as main components. For example, the metal of the base material of the first terminal main body 81A and the second terminal main body 81B may be a Fe-42Ni alloy, a Fe-18Cr alloy, or a Cu-8Sn alloy. Furthermore, from the viewpoint of heat dissipation, the metal of the base material of the first terminal main body 81A and the second terminal main body 81B may be oxygen-free copper or Cu-based alloy having high thermal conductivity. Thus, with such a copper-base material having high thermal conductivity for the material of the first terminal main body 81A and the second terminal main body 81B, it is possible to achieve low ESR and low thermal resistance. Furthermore, in the present preferred embodiment, stainless steel or aluminum having low solder wettability may be used for the metal of the base material of the first terminal main body 81A and the second terminal main body 81B. At least the surfaces of the metals of the base materials of the first terminal main body 81A and the second terminal main body 81B have lower solder wettability than the surfaces of the first plating film 82A and the second plating film 82B described later. The thicknesses of the first terminal main body 81A and the second terminal main body 81B are preferably about 0.05 mm to about 0.5 mm, for example.

The first plating film 82A and the second plating film 82B preferably have a two-layer structure including an upper plating film provided on the lower plating film. The lower plating film preferably includes, for example, Ni, Fe, Cu, Ag, Cr, or an alloy including one or more of these metals as main components. More preferably, the lower plating film preferably includes, for example, Ni, Fe, Cr, or an alloy including one or more of these metals as main components. Since the lower plating film includes Ni, Fe, Cr having a high melting point, or an alloy including one or more of these metals as main components, it is possible to improve the heat resistance of the metal terminal 80. The thickness of the lower plating film is preferably about 0.2 μm or more and about 5.0 μm or less, for example. The upper plating film is preferably made of Sn, Ag, Au, or an alloy including one or more of these metals as main components, for example. More preferably, the upper plating film is made of, for example, Sn or an alloy including Sn as a main component. Since the upper plating film includes Sn or an alloy including Sn as a main component, it is possible to improve the solderability between the external electrode 40 and the metal terminal 80. At least the surfaces of the first plating film 82A and the second plating film 82B have higher solder wettability than the surfaces of the metals of the base materials of the first terminal main body 81A and the second terminal main body 81B. The thickness of the upper plating film is preferably about 1.0 μm or more and about 5.0 μm or less, for example.

The first recess portion 90A in the first metal terminal 80A includes cavities. The first recess portion 90A exposes the first terminal main body 81A. That is, a surface in the first recess portion 90A includes a surface to which the first plating film 82A is not applied. Therefore, when the first external electrodes 40A and the first metal terminal 80A are bonded to each other by the first bonding material 5A, the first bonding material 5A hardly flows into the first recess portion 90A. In particular, when the first terminal main body 81A is made of a metal having relatively poor wettability, such as stainless steel or aluminum, for example, the first bonding material 5A is more difficult to flow into the first recess portion 90A.

The second recess portion 90B in the second metal terminal 80B includes cavities. The second recess portion 90B exposes the second terminal main body 81B. That is, a surface in the second recess portion 90B includes a surface to which the second plating film 82B is not applied. Therefore, when the second external electrode 40B and the second metal terminal 80B are bonded to each other by the second bonding material 5B, the second bonding material 5B hardly flows into the second recess portion 90B. In particular, when the second terminal main body 81B is made of a metal having relatively poor wettability such as stainless steel or aluminum, for example, the second bonding material 5B is more difficult to flow into the second recess portion 90B.

Next, shapes and the like of the first recess portion 90A in the first metal terminal 80A and the second recess portion 90B in the second metal terminal 80B will be described in detail.

Figure 8:
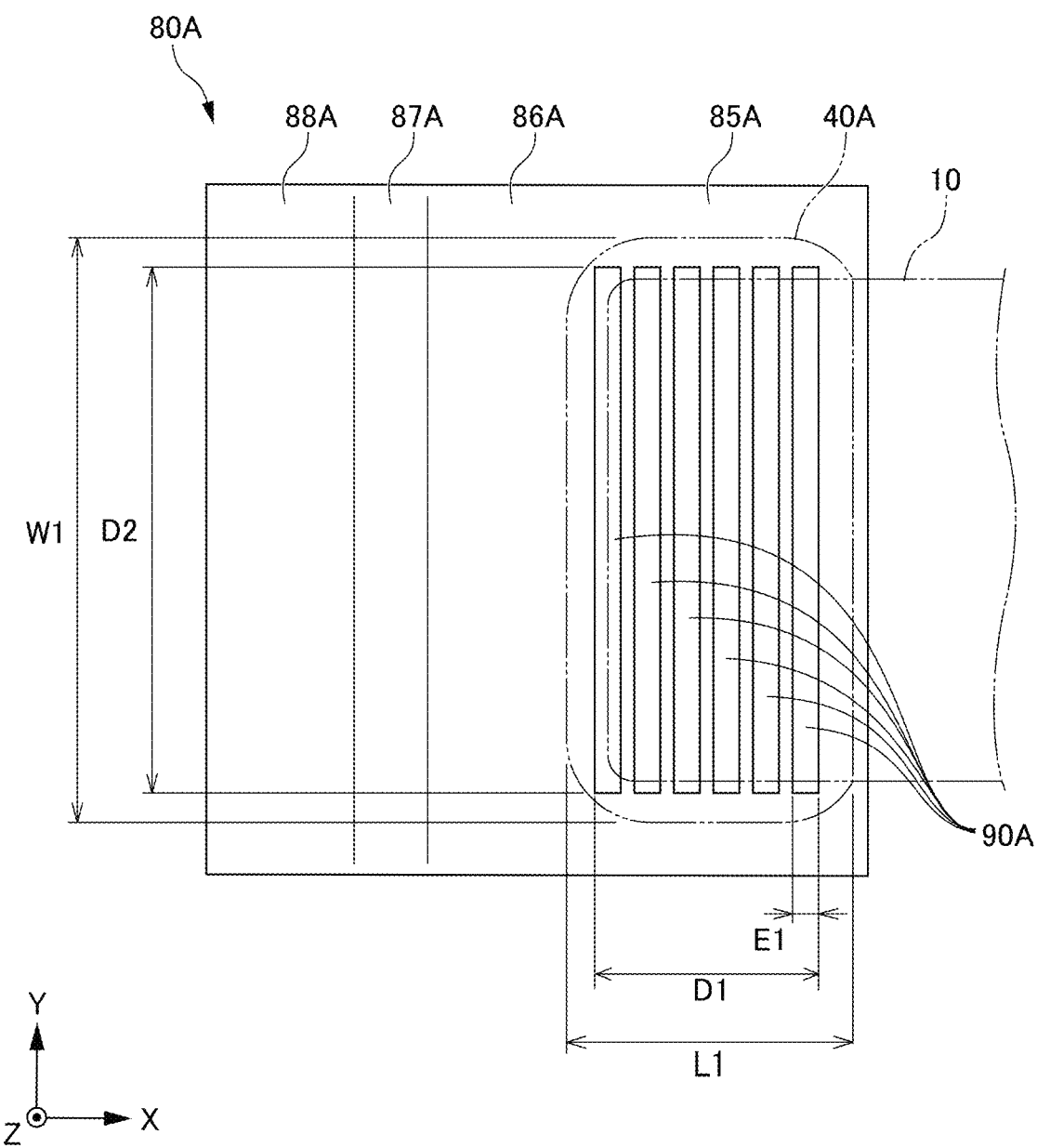
FIG. 8 is a view when a first metal terminal of the multilayer ceramic capacitor of FIG. 7 is viewed in the direction of the arrow VIII.

FIG. 8 is a view when the first metal terminal 80A of the multilayer ceramic capacitor 1 of FIG. 7 is viewed in the direction of the arrow VIII. FIG. 8 shows the first metal terminal 80A before the multilayer ceramic capacitor main body 2 is connected thereto. FIG. 8 illustrates outline shapes of the multilayer body 10 and the external electrodes 40 when the multilayer ceramic capacitor main body 2 is connected to the first metal terminal 80A by a two-dot chain line.

The first recess portion 90A includes a plurality of recess portions positioned side by side in the length direction L. The plurality of recess portions included in the first recess portion 90A are provided at the first bonding portion 85A of the first metal terminal 80A. The shapes, sizes, and number of the plurality of recess portions included in the first recess portion 90A are not particularly limited. In the present preferred embodiment, for example, six elongated, rectangular or substantially rectangular recess portions are provided in the first bonding portion 85A.

It is preferable that the dimension D1 in the length direction L of the entire first recess portion 90A including the plurality of recess portions is shorter than the length L1 in the length direction L of the first external electrode 40A. Furthermore, the dimension D2 in the width direction W of each of the plurality of recess portions is preferably shorter than the length W1 in the width direction W of the first external electrode 40A. As described above, it is preferable that the first recess portion 90A have a size hidden by the first external electrode 40A when viewed in the height direction T.

As a result, it is possible to reduce or prevent the resin of the exterior material 3 from flowing into the first recess portion 90A when covered with the exterior material 3 by the transfer molding method or the like. In other words, it is possible to reduce or prevent the cavities from becoming small.

It is preferable that the dimension E1 in the length direction L of each of the plurality of recess portions included in the first recess portion 90A is about 10 μm or more and about 100 μm or less, for example.

As described above, it is preferable that the first recess portion 90A have a size hidden by the first external electrodes 40A when viewed in the height direction T. However, even when the first recess portion 90A is not hidden by the first external electrodes 40A when viewed in the height direction T, by setting the dimension D1 to the above-described dimension, the resin of the exterior material 3 hardly flows into the first recess portion 90A. Therefore, it is possible to reduce or prevent the cavities provided in the first recess portion 90A from becoming small.

When the dimension D1 exceeds about 100 µm, the resin tends to flow into the first recess portion 90A during molding of the resin of the exterior material 3, and thus, the hollow portion tends to be small. Furthermore, when the dimension D1 is smaller than about 10 µm, when the first bonding material 5A during reflow at the time of mounting the multilayer ceramic capacitor 1 on the mounting board is volumetrically expanded by melting, the first bonding material 5A hardly flows into the cavities.

A dimension in the depth direction of the first recess portion 90A is acceptable as long as the first terminal main body 81A is not cut, and may be, for example, about 30% or more and about 70% or less of the thickness of the first metal terminal 80A.

Here, the first metal terminal 80A and the second metal terminal 80B are substantially plane symmetrical to each other with respect to the cross section WT in the middle in the length direction L of the multilayer ceramic capacitor 1. Therefore, the second recess portion 90B of the second metal terminal 80B has the same or similar configuration to the first recess portion 90A of the first metal terminal 80A.

The second recess portion 90B includes a plurality of recess portions positioned side by side in the length direction L. The plurality of recess portions included in the second recess portion 90B are provided at the second bonding portion 85B of the second metal terminal 80B. The shapes, sizes, and number of the plurality of recess portions included in the second recess portion 90B are not particularly limited. In the present preferred embodiment, for example, six elongated, rectangular or substantially rectangular recess portions are provided in the second bonding portion 85B.

It is preferable that the dimension in the length direction L of the entire second recess portion 90B including the plurality of recess portions is shorter than the length L2 in the length direction L of the second external electrode 40B. Furthermore, the dimension in the width direction W of each of the plurality of recess portions is preferably shorter than the length W2 in the width direction W of the second external electrode 40B. As described above, it is preferable that the second recess portion 90B have a size hidden by the second external electrode 40B when viewed in the height direction T.

It is preferable that the dimension in the length direction L of each of the plurality of recess portions included in the second recess portion 90B is about 10 µm or more and about 100 µm or less, for example.

A dimension in the depth direction of the second recess portion 90B is acceptable as long as the second terminal main body 81B is not cut, and may be, for example, about 30% or more and about 70% or less of the thickness of the second metal terminal 80B.

The bonding material 5 is preferably solder. For example, Pb-free solder may be used. Examples of the Pb-free solder preferably include a lead-free solder such as Sn—Sb, Sn—Ag—Cu, Sn—Cu, and Sn—Bi. For example, Sn-10Sb to Sn-15Sb solders may be used.

The exterior material 3 covers the multilayer ceramic capacitor main body 2, the first bonding material 5A and the second bonding material 5B, a portion of the first metal terminal 80A, and a portion of the second metal terminal 80B. More specifically, the exterior material 3 covers the entire or substantially the entire multilayer ceramic capacitor main body 2, the entire or substantially the entire first bonding material 5A and the second bonding material 5B, the entire or substantially the entire first bonding portion 85A of the first metal terminal 80A and at least a portion of the first extending portion 86A, the entire or substantially the entire second bonding portion 85B of the second metal terminal 80B and at least a portion of the third extending portion 86B. Thus, the exterior material 3 covers the conductor metal portion such as the external electrode 40 and the metal terminal 80 in a wide range, such that it is possible to ensure the insulating surface distance between the conductors (creepage distance). Furthermore, it is possible to avoid the surface discharge risk by the exterior material 3 covering the conductor metal portion in a wide range.

As shown in FIGS. 1 and 2, the exterior material 3 includes a first main surface MTS1 and a second main surface MTS2 opposed to each other in the height direction T, a first side surface MWS1 and a second side surface MWS2 opposed to each other in the width direction W orthogonal or substantially orthogonal to the height direction T, and a first end surface MLS1 and a second end surface MLS2 opposed to each other in the length direction L orthogonal or substantially orthogonal to the height direction T and the width direction W.

As shown in FIG. 1, the exterior material 3 of the present preferred embodiment has a rectangular or substantially rectangular parallelepiped shape, for example. However, the shape of the exterior material 3 is not particularly limited. For example, the exterior material 3 may have a trapezoidal cross-section in which the first end surface MLS1 and the second end surface MLS2 are sloped. The exterior material 3 may also be a truncated cone, such as a truncated pyramid, for example. The shape of the corner portion of the exterior material 3 is not particularly limited, and may be rounded, for example.

It is preferable that the first main surface MTS1 and the second main surface MTS2 of the exterior material 3 have a planar shape having a predetermined flatness. Thus, it is possible to reduce or prevent the suction failure of a mounter of a mounting machine used when mounting the multilayer ceramic capacitor 1 on the mounting board. Therefore, it is possible to reliably mount the multilayer ceramic capacitor 1 on the mounting board. As a result, it is possible to reduce or prevent the occurrence of mounting defects.

The exterior material 3 is formed by coating, for example, a liquid or powder silicone-based or epoxy-based resin. Furthermore, the exterior material 3 may be molded by molding engineering plastic by a transfer molding method, an injection molding method, or the like. In particular, it is preferable that the material of the exterior material 3 is made of a thermosetting epoxy resin, for example. Thus, it is possible to ensure the adhesion between the exterior material 3, and the multilayer ceramic capacitor main body 2 and the metal terminal 80, and thus it is possible to obtain an advantageous effect of improving the withstand voltage and moisture resistance performance.

As described above, the multilayer ceramic electronic component 1 according to the present preferred embodiment includes the multilayer ceramic electronic component main body 2 including the multilayer body 10 including the plurality of laminated dielectric layers 20 and the plurality of laminated internal electrode layers 30, and external electrodes 40 each connected to the internal electrode layers 30, and the metal terminals 80 each connected to the external electrodes 40 respectively with the bonding materials 5. The metal terminals 80 each include a terminal main body and a plating film provided on a surface of the terminal main body. The metal terminals 80 each include a surface connected to the external electrode 40 on which the recess portion 90 is provided such that the terminal main body is exposed. The recess portion 90 includes cavities. The exterior material 3 covers the multilayer ceramic electronic component main body 2, the bonding materials 5, and at least a portion of each of the metal terminals 80.

More specifically, the multilayer ceramic electronic component 1 includes the multilayer ceramic electronic component main body 2 including the multilayer body 10, the first external electrode 40A, and the second external electrode 40B, the multilayer body including the plurality of laminated dielectric layers 20 and the plurality of laminated internal electrode layers 30, and further including the first main surface TS1 and the second main surface TS2 opposed to each other in the height direction, the first side surface WS1 and the second side surface WS2 opposed to each other in the width direction orthogonal or substantially orthogonal to the height direction, and the first end surface LS1 and the second end surface LS2 opposed to each other in the length direction orthogonal or substantially orthogonal to the height direction and the width direction, the first external electrode being provided in a vicinity of the first end surface LS1, and the second external electrode being provided in a vicinity of the second end surface LS2, the first metal terminal 80A connected to the first external electrode 40A via the bonding material 5, and the second metal terminal 80B connected to the second external electrode 40B via the bonding material 5, in which the first metal terminal 80A includes the first terminal main body 81A, and the first plating film 82A provided on a surface of the first terminal main body 81A, the second metal terminal 80B includes the second terminal main body 81B, and the second plating film 82B provided on a surface of the second terminal main body 81B, the first metal terminal 80A includes a surface connected to the first external electrode 40A on which the first recess portion 90A is provided such that the first terminal main body 81A is exposed, the second metal terminal 80B includes a surface connected to the second external electrode 40B on which the second recess portion 90B is provided such that the second terminal main body 81B is exposed, the first recess portion 90A and the second recess portion 90B each include cavities, and the exterior material 3 covers the multilayer ceramic electronic component main body 2, the bonding material 5, a portion of the first metal terminal 80A, and a portion of the second metal terminal 80B.

When the dimension in the length direction of the multilayer ceramic capacitor 1 including the exterior material 3 and the metal terminals 80 is defined as L, the dimension L is preferably about 3.2 mm or more and about 20 mm or less, for example. Furthermore, when the dimension in the lamination direction of the multilayer ceramic capacitor 1 is defined as T, the dimension T is preferably about 1.0 mm or more and about 10 mm or less, for example. Furthermore, when the dimension in the width direction of the multilayer ceramic capacitor 1 is defined as W, the dimension W is preferably about 1.5 mm or more and about 20 mm or less, for example.

Next, a non-limiting example of a method of manufacturing the multilayer ceramic capacitor 1 of the present preferred embodiment will be described. First, a method of manufacturing the multilayer ceramic capacitor main body 2 will be described.

A dielectric sheet for the dielectric layer 20 and a conductive paste for the internal electrode layer 30 are provided. The conductive paste for the internal electrode and the dielectric sheet includes a binder and a solvent. Known binders and solvents may be used.

The conductive paste for the internal electrode layer 30 is printed on the dielectric sheet in a predetermined pattern by, for example, screen printing or gravure printing. Thus, the dielectric sheet in which the pattern of the first internal electrode layer 31 is formed, and the dielectric sheet in which the pattern of the second internal electrode layer 32 is formed are provided.

A predetermined number of dielectric sheets in which the pattern of the internal electrode layer is not printed are laminated (stacked), such that a portion defining and functioning as the first main surface-side outer layer portion 12 in a vicinity of the first main surface TS1 is formed. The dielectric sheet in which the pattern of the first internal electrode layer 31 is printed and the dielectric sheet in which the pattern of the second internal electrode layer 32 is printed are sequentially laminated thereon, such that a portion defining and functioning as the inner layer portion 11 is formed. A predetermined number of the dielectric sheets in which the pattern of the internal electrode layer is not printed are laminated on the portion defining and functioning as the inner layer portion 11, such that a portion defining and functioning as the second main surface-side outer layer portion 13 in a vicinity of the second main surface TS2 is formed. Thus, a laminated sheet is manufactured.

The laminated sheets are pressed in the lamination direction by hydrostatic pressing, for example, and a laminated block is manufactured.

The laminated block is cut to a predetermined size, such that a laminated (multilayer) chip is cut out. At this time, corner portions and ridge portions of the laminated chip may be rounded by barrel polishing or the like, for example.

The laminated chip is fired to manufacture the multilayer body 10. The firing temperature depends on the materials of the dielectric layer 20 and the internal electrode layer 30. However, the firing temperature is preferably about 900° C. or more and about 1400° C. or less, for example.

The conductive paste defining and functioning as the first base electrode layer 50A and the second base electrode layer 50B is applied to both end surfaces of the multilayer body 10. In the present preferred embodiment, the first base electrode layer 50A and the second base electrode layer 50B are fired layers, for example. For example, a conductive paste including a glass component and metal is applied to the multilayer body 10 by, for example, a method such as dipping. Thereafter, a firing process is performed to form the first base electrode layer 50A and the second base electrode layer 50B. The temperature of the firing process at this time is preferably about 700° C. or higher and about 900° C. or lower, for example.

In a case in which the laminated chip before firing and the conductive paste applied to the laminated chip are fired simultaneously, it is preferable that the fired layer is formed by firing an added ceramic material, instead of a glass component. At this time, it is particularly preferable to use the same type of ceramic material as the dielectric layer 20 as the ceramic material to be added. In this case, the conductive paste is applied to the laminated chip before firing, and the laminated chip and the conductive paste applied to the laminated chip are fired simultaneously to form the multilayer body 10 including the fired layer formed therein.

When a thin film layer is formed as the first base electrode layer 50A and the second base electrode layer 50B, a thin film layer may be formed on a portion of the first main surface TS1 and a portion of the second main surface TS2 of the multilayer body 10. The thin film layer may be, for example, a sputtering electrode by a sputtering method. In a case in which the sputtering electrode is formed on a portion of the first main surface TS1 and a portion of the second main surface TS2 of the multilayer body 10 as the first base electrode layer 50A and the second base electrode layer 50B, a fired layer is formed on the first end surface LS1 and on the second end surface LS2. Alternatively, a plated layer, which will be described later, may be formed directly on the multilayer body 10 without forming the base electrode layer on the first end surface LS1 and the second end surface LS2.

Thereafter, the first plated layer 70A is formed on the first base electrode layer 50A. Furthermore, the second plated layer 70B is formed on the second base electrode layer 50B. In the present preferred embodiment, for example, the Ni-plated layer and the Sn-plated layer are formed as the plated layers. The Ni-plated layer and the Sn-plated layer are sequentially formed, for example, by a barrel plating method.

By such a manufacturing process, the multilayer ceramic capacitor main body 2 is manufactured.

Next, a non-limiting example of a method of manufacturing the first metal terminal 80A and the second metal terminal 80B will be described.

The first plating film 82A is applied to the first terminal main body 81A. Thereafter, a portion of the first terminal main body 81A to which the first plating film 82A is applied is scraped off together with the first plating film 82A to form the first recess portion 90A. Thus, the first terminal main body 81A, which is a base material of the first metal terminal 80A, is exposed, and the first recess portion 90A with a surface having low solder wettability is formed.

Similarly for the second metal terminal 80B, the second plating film 82B is applied to the second terminal main body 81B. Thereafter, a portion of the second terminal main body 81B to which the second plating film 82B is applied is scraped off together with the second plating film 82B to form the second recess portion 90B. Thus, the second terminal main body 81B, which is a base material of the second metal terminal 80B is exposed, and the second recess portion 90B with a surface having low solder wettability is formed.

After the first recess portion 90A and the second recess portion 90B are formed in the first terminal main body 81A and the second terminal main body 81B, the first plating film 82A and the second plating film 82B may be applied thereto with the first recess portion 90A and the second recess portion 90B being masked. As a result, the first recess portion 90A in which the first terminal main body 81A is exposed and the second recess portion 90B in which the second terminal main body 81B is exposed are similarly formed.

Next, a description will be provided of a step of bonding the multilayer ceramic capacitor main body 2 and the first metal terminal 80A and the second metal terminal 80B.

The first external electrode 40A and the first metal terminal 80A are bonded by the first bonding material 5A. The second external electrode 40B and the second metal terminal 80B are bonded by the second bonding material 5B. In the present preferred embodiment, the first bonding material 5A and the second bonding material 5B are solder. For example, when the bonding is performed by reflow soldering, the first bonding material 5A and the second bonding material 5B are heated at a temperature of about 270° C. or more and about 290° C. or less for about 30 seconds or more, for example.

The first bonding material 5A and the second bonding material 5B are melted by the heat at the time of the reflow. However, since the plating film is not provided on the surfaces in the first recess portion 90A and the second recess portion 90B, the melted first bonding material 5A and the melted second bonding material 5B hardly flow into the first recess portion 90A and the second recess portion 90B. Therefore, after being heated, the first bonding material 5A and the second bonding material 5B are solidified with the cavities remaining in the first recess portion 90A and the second recess portion 90B, and the multilayer ceramic capacitor main body 2, and the first metal terminal 80A and the second metal terminal 80B are bonded to each other.

Next, a description will be provided of a step of the exterior material 3 covering the multilayer ceramic capacitor main body 2, the first bonding material 5A and the second bonding material 5B, a portion of the first metal terminal 80A, and a portion of the second metal terminal 80B.

The exterior material 3 is formed by, for example, a transfer molding method. More specifically, a mold is filled with a resin of the exterior material 3, and a multilayer ceramic capacitor before being covered with the exterior material 3, that is, the multilayer ceramic capacitor main body 2 to which the metal terminal 80 is bonded via the bonding material 5 is provided, such that the resin is cured. Thus, the exterior material 3 is provided which covers the multilayer ceramic capacitor main body 2, the first bonding material 5A and the second bonding material 5B, a portion of the first metal terminal 80A, and a portion of the second metal terminal 80B.

Finally, when there is an unnecessary portion in the metal terminal 80, the unnecessary portion is cut using a punching die or the like, for example. Then, using a bending mold or the like, for example, the metal terminal 80 is bent to a desired shape.

The multilayer ceramic capacitor 1 of the present preferred embodiment is manufactured by the above-described manufacturing methods, for example.

As described above, the non-limiting example method of manufacturing the multilayer ceramic capacitor 1 of the present preferred embodiment includes an electronic component body preparation step of preparing the multilayer ceramic capacitor main body 2 including the external electrodes 40, a metal terminal preparation step of preparing members defining and functioning as the metal terminals 80, a step of connecting the members defining and functioning as the metal terminals 80 to the external electrodes 40 via the bonding materials 5, and a step of the exterior material 3 covering the multilayer ceramic capacitor main body 2, the bonding materials 5, and a portion of each of the members serving as the metal terminals 80. The metal terminals 80 each include the terminal main body, and the plating film provided on the surface of the terminal main body. The metal terminals 80 each include a surface connected to the external electrode 40 on which the recess portion 90 is provided such that the terminal main body is exposed. The recess portion 90 includes cavities. The metal terminal preparation step may further include a step of scraping off a portion of the terminal main body to which the plating film is applied together with the plating film to form the recess portion 90.

FIG. 21 shows a mounting structure 300 of the multilayer ceramic electronic component 1 according to a preferred embodiment of the present invention. The multilayer ceramic capacitor 1 as a finished product covered with the exterior material 3 is, thereafter, as a component, reflow mounted on a mounting board 310 via a board mounting bonding material 320. At this time, there is a possibility that the bonding material 5 melts and the volume of the bonding material 5 expands. However, the bonding material 5 flows into the cavities of the recess portion 90, such that it is possible to reduce or prevent an increase in the internal pressure of the exterior material 3. Furthermore, by reducing or preventing an increase in the internal pressure of the exterior material 3, it is possible to reduce or prevent the generation of stress, such that the resin included in the exterior material 3 is peeled off from the metal terminal 80.

Furthermore, it is possible to reduce or prevent the bonding material 5 from flowing out to the outside.

Furthermore, in a state in which the resin included in the exterior material 3 absorbs moisture, since water vapor is generated from the resin during reflow at the time of board mounting, the pressure inside the exterior material 3 tends to be further increased. In such a case, there is a possibility that the problem of solder splashing or the like which causes the bonding material 5 to flow out to the outside occurs. However, with the configuration of the multilayer ceramic capacitor 1 of the present preferred embodiment, the bonding material 5 flows into the cavities of the recess portion 90, such that it is possible to reduce or prevent an increase in the internal pressure of the exterior material 3. Therefore, it is possible to reduce or prevent the occurrence of problems, such as solder splashing.

In addition, it is generally preferable that the melting point of the bonding material used in the preceding step is higher than the melting point of the bonding material used in the subsequent step. That is, it is preferable that the melting point of the bonding material 5 used in the previous step for connecting the external electrode 40 and the metal terminal 80 is higher than the melting point of the board mounting bonding material 320 used in the subsequent step when mounting the completed multilayer ceramic capacitor 1 on the mounting board 310. However, this is not limited in the present preferred embodiment, and a case in which the melting point of the bonding material 5 is lower than the melting point of the board mounting bonding material is also acceptable in the present invention. In addition, the same or similar melting points are also acceptable. For example, the bonding material 5 and the board mounting bonding material may be the same type of bonding material. That is, in the multilayer ceramic capacitor 1 of the present preferred embodiment, the degree of freedom in selecting the type of bonding material to be used in the bonding material 5 and the board mounting bonding material 320 is increased. Furthermore, the degree of freedom of temperature setting during reflow of the subsequent process is also increased. It should be noted that, in the multilayer ceramic capacitor 1 of the present preferred embodiment, even if the bonding material 5 is melted at a temperature during reflow in the subsequent process, since the bonding material 5 flows into the cavities of the recess portion 90, it is possible to reduce or prevent an increase in the internal pressure of the exterior material 3.

In the multilayer ceramic electronic component 1 of the present preferred embodiment configured as described above, upon mounting the multilayer ceramic electronic component 1 on the mounting board 310 by reflow mounting, when the bonding material 5A connecting the first external electrode 40A and the first metal terminal 80A and the bonding material 5B connecting the second external electrode 40B and the second metal terminal 80B are melted, molten bonding materials 5 flow into the first recess portion 90A and the second recess portion 90B.

That is, the mounting structure 300 of the multilayer ceramic electronic component of the present preferred embodiment includes the multilayer ceramic electronic component 1 and the mounting board 310. The cavities provided in the first recess portion 90A and the second recess portion 90B include the bonding materials 5 which are melted and flow thereinto upon mounting the multilayer ceramic electronic component 1 to the mounting board 310 by reflow mounting.

Figure 9:
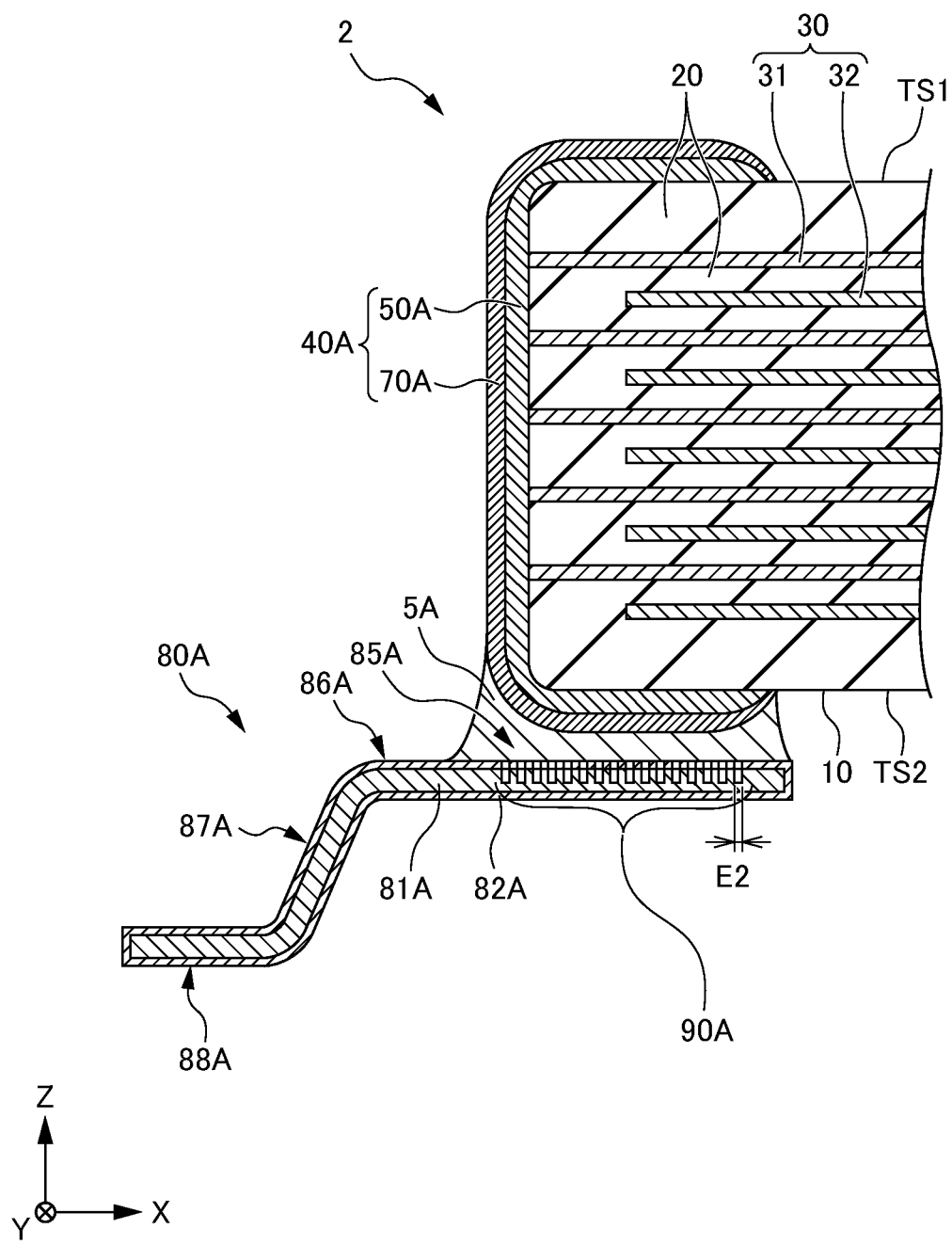
FIG. 9 is a cross-sectional view of a multilayer ceramic capacitor of a first modified example of the first preferred embodiment of the present invention, and is a diagram corresponding to FIG. 7.

Hereinafter, a description will be provided of a first modified example of the multilayer ceramic capacitor 1 of the present preferred embodiment. In the following description, the same or corresponding components as those of the above preferred embodiment are denoted by the same reference numerals, and detailed descriptions thereof are omitted. FIG. 9 is a cross-sectional view showing a first modified example of the multilayer ceramic capacitor 1 of the present preferred embodiment, and is a diagram corresponding to FIG. 7.

In the present modified example, the structure of the recess portion 90 provided in the metal terminal 80, that is, the structure of the first recess portion 90A provided in the first metal terminal 80A and the structure of the second recess portion 90B provided in the second metal terminal 80B, differ from the structure of the above preferred embodiment.

It should be noted that the first metal terminal 80A and the second metal terminal 80B are substantially plane symmetrical to each other with respect to the cross section WT in the middle in the length direction L of the multilayer ceramic capacitor 1. Therefore, the first recess portion 90A provided in the first metal terminal 80A and the second recess portion 90B provided in the second metal terminal 80B have the same or substantially the same configuration. Therefore, the first recess portion 90A provided in the first metal terminal 80A will be described as an example. It should be noted that the same applies to the second modified example to the fifth modified example of the present preferred embodiment, which will be described later.

As shown in FIG. 9, a plurality of recess portions included in the first recess portion 90A of the present modified example each have a shorter dimension E2 in the length direction L than each of the plurality of recess portions of the above preferred embodiment. Furthermore, the first recess portion 90A of the present modified example includes a larger number of elongated and rectangular or substantially rectangular recess portions.

For example, the dimension E2 in the length direction L of each of the plurality of recess portions included in the first recess portion 90A is about 10 µm or more and about 20 µm or less.

The structure of the first recess portion 90A provided in the first metal terminal 80A and the second recess portion 90B provided in the second metal terminal 80B in the present modified example still obtains the same advantageous effects as in the above preferred embodiment.

Figure 10:
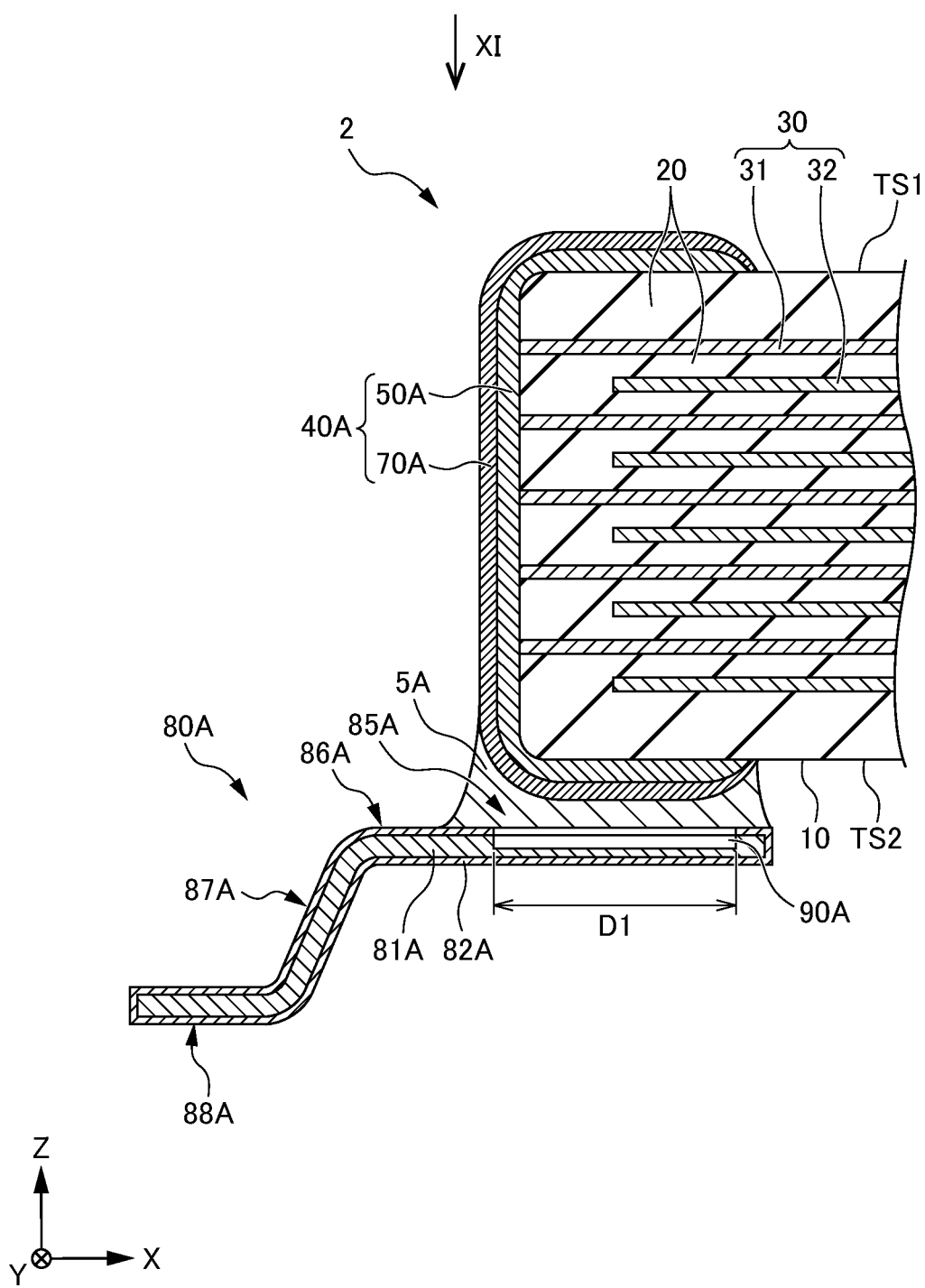
FIG. 10 is a cross-sectional view of a multilayer ceramic capacitor of a second modified example of the first preferred embodiment of the present invention, and is a diagram corresponding to FIG. 7.
Figure 11:
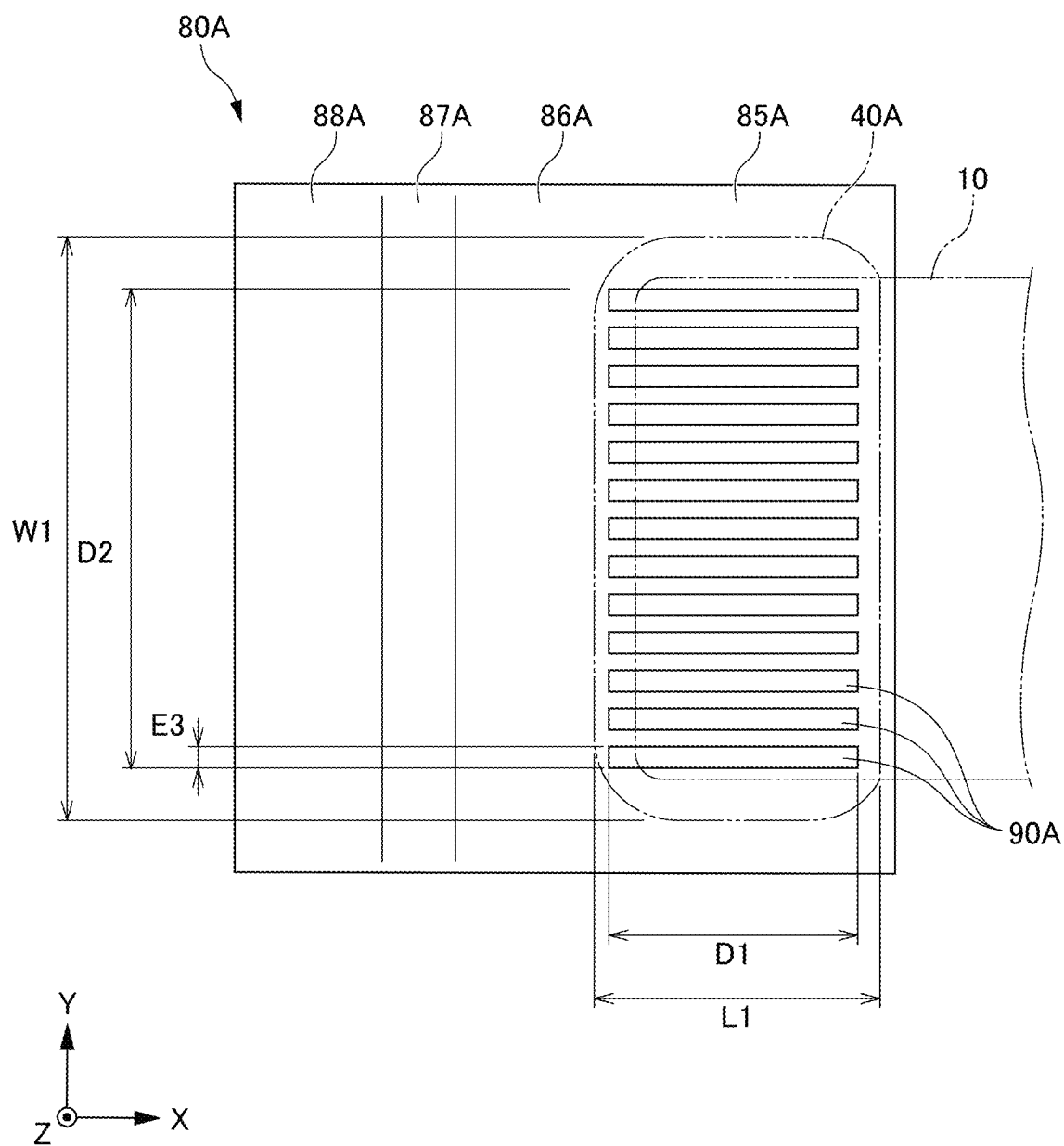
FIG. 11 is a view when the first metal terminal of the multilayer ceramic capacitor of FIG. 10 is viewed in the direction of the arrow XI, and is a diagram corresponding to FIG. 8.

Hereinafter, a description will be provided of a second modified example of the multilayer ceramic capacitor 1 of the present preferred embodiment. In the following description, the same or corresponding components as those of the above preferred embodiment are denoted by the same reference numerals, and detailed descriptions thereof are omitted. FIG. 10 is a cross-sectional view showing a second modified example of the multilayer ceramic capacitor 1 of the present preferred embodiment, and is a diagram corresponding to FIG. 7. FIG. 11 is a view when the first metal terminal 80A of the multilayer ceramic capacitor 1 in FIG. 10 is viewed in the direction of the arrow XI, and is a diagram corresponding to FIG. 8.

In the present modified example, the structure of the first recess portion 90A provided in the first metal terminal 80A and the structure of the second recess portion 90B provided in the second metal terminal 80B differ from the structure of above preferred embodiment.

As shown in FIGS. 10 and 11, the first recess portion 90A of the present modified example includes a plurality of recess portions positioned side by side in the width direction W. There is no particular limitation on the number of the plurality of recess portions included in the first recess portion 90A. However, in the present modified example, for example, thirteen elongated and rectangular or substantially rectangular recess portions are provided in the first bonding portion 85A.

It is preferable that the dimension D1 in the length direction L of each of the plurality of recess portions included in the first recess portion 90A is shorter than the length L1 in the length direction L of the first external electrode 40A. Furthermore, the dimension D2 in the width direction W of the first recess portion 90A including the plurality of recess portions is preferably shorter than the length W1 in the width direction W of the first external electrode 40A. As described above, it is preferable that the first recess portion 90A has a size hidden by the first external electrode 40A when viewed in the height direction T.

The dimension E3 in the width direction W of each of the plurality of recess portions included in the first recess portion 90A is preferably about 10 μm or more and about 100 μm or less, for example.

The structure of the second recess portion 90B provided in the second metal terminal 80B is the same or substantially the same as the structure of the first recess portion 90A provided in the first metal terminal 80A.

The structure of the first recess portion 90A provided in the first metal terminal 80A and the second recess portion 90B provided in the second metal terminal 80B in the present modified example still obtains the same advantageous effects as in the above preferred embodiment.

Figure 12:
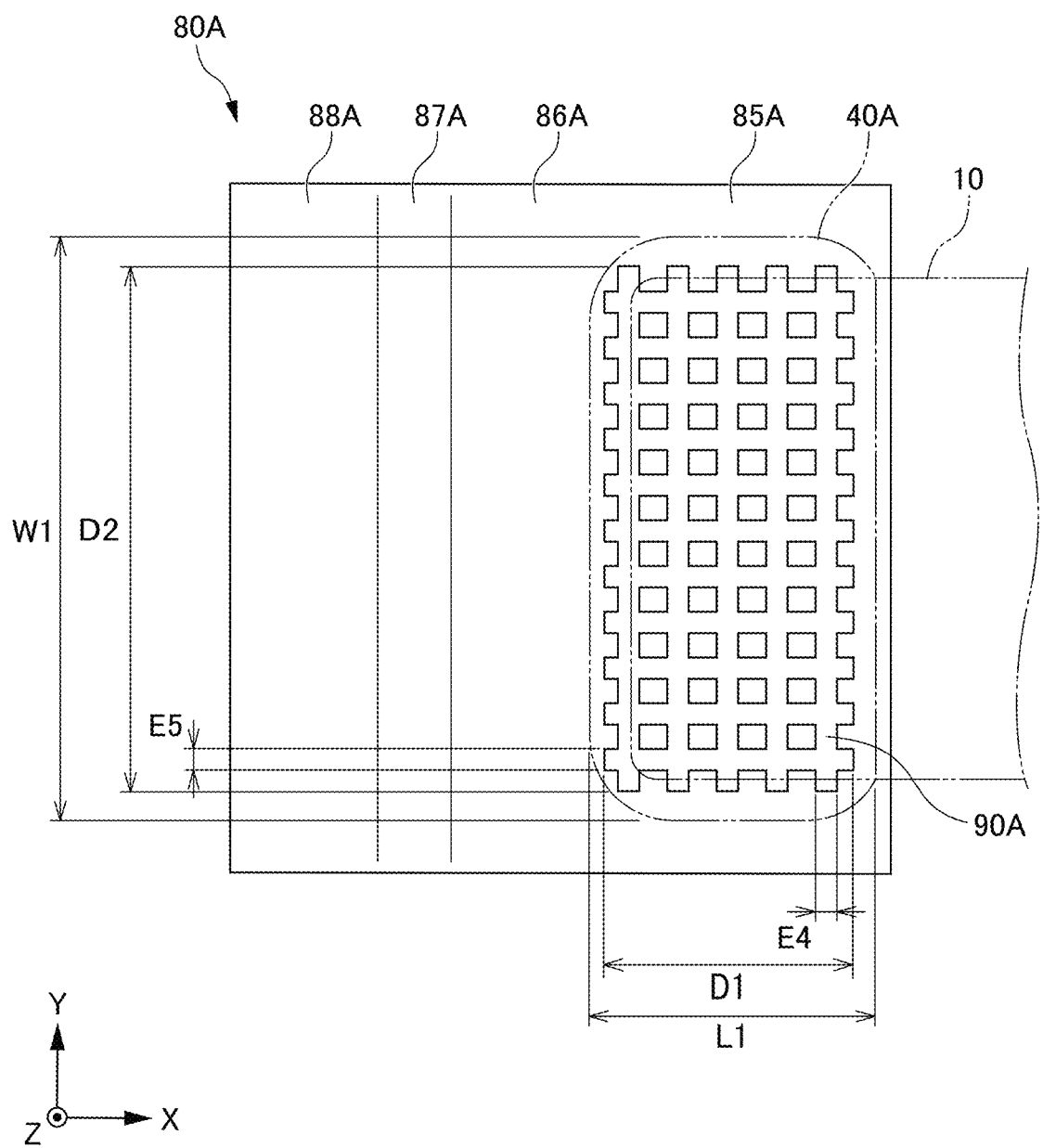
FIG. 12 is a diagram showing a first metal terminal according to a third modified example of the first preferred embodiment of the present invention, and is a diagram corresponding to FIG. 8.

Hereinafter, a description will be provided of a third modified example of the multilayer ceramic capacitor 1 of the present preferred embodiment. In the following description, the same or corresponding components as those of the above preferred embodiment are denoted by the same reference numerals, and detailed descriptions thereof are omitted. FIG. 12 is a diagram showing a first metal terminal 80A according to a third modified example of the present preferred embodiment, and is a diagram corresponding to FIG. 8.

In the present modified example, the mode of the first recess portion 90A provided in the first metal terminal 80A and the mode of the second recess portion 90B provided in the second metal terminal 80B differ from the mode of above preferred embodiment.

As shown in FIG. 12, the first recess portion 90A of the present modified example includes a grid-shaped recess portion, in which a plurality of recess portions positioned side by side in the length direction L, and a plurality of recess portions positioned side by side in the width direction W are provided in an intersecting manner. The grid-shaped recess portion included in the first recess portion 90A is provided at the first bonding portion 85A.

It is preferable that the dimension D1 in the length direction L of the grid-shaped recess portion included in the first recess portion 90A is shorter than the length L1 in the length direction L of the first external electrode 40A. Furthermore, the dimension D2 in the width direction W of the first recess portion 90A including the grid-shaped recess portion is preferably shorter than the length W1 in the width direction W of the first external electrode 40A. As described above, it is preferable that the first recess portion 90A have a size hidden by the first external electrode 40A when viewed in the height direction T.

It is preferable that the dimension E4 in the length direction L of the plurality of recess portions included in the grid-shaped recess portion and positioned side by side in the length direction L, and the dimension E5 in the width direction W of the plurality of recess portions included in the grid-shaped recess portion and positioned side by side in the width direction W are, for example, about 10 μm or more and about 100 μm or less, respectively.

The structure of the second recess portion 90B provided in the second metal terminal 80B is the same or substantially the same as the structure of the first recess portion 90A provided in the first metal terminal 80A.

The structure of the first recess portion 90A provided in the first metal terminal 80A and the second recess portion 90B provided in the second metal terminal 80B in the present modified example still obtains the same advantageous effects as in the above preferred embodiment.

Figure 13:
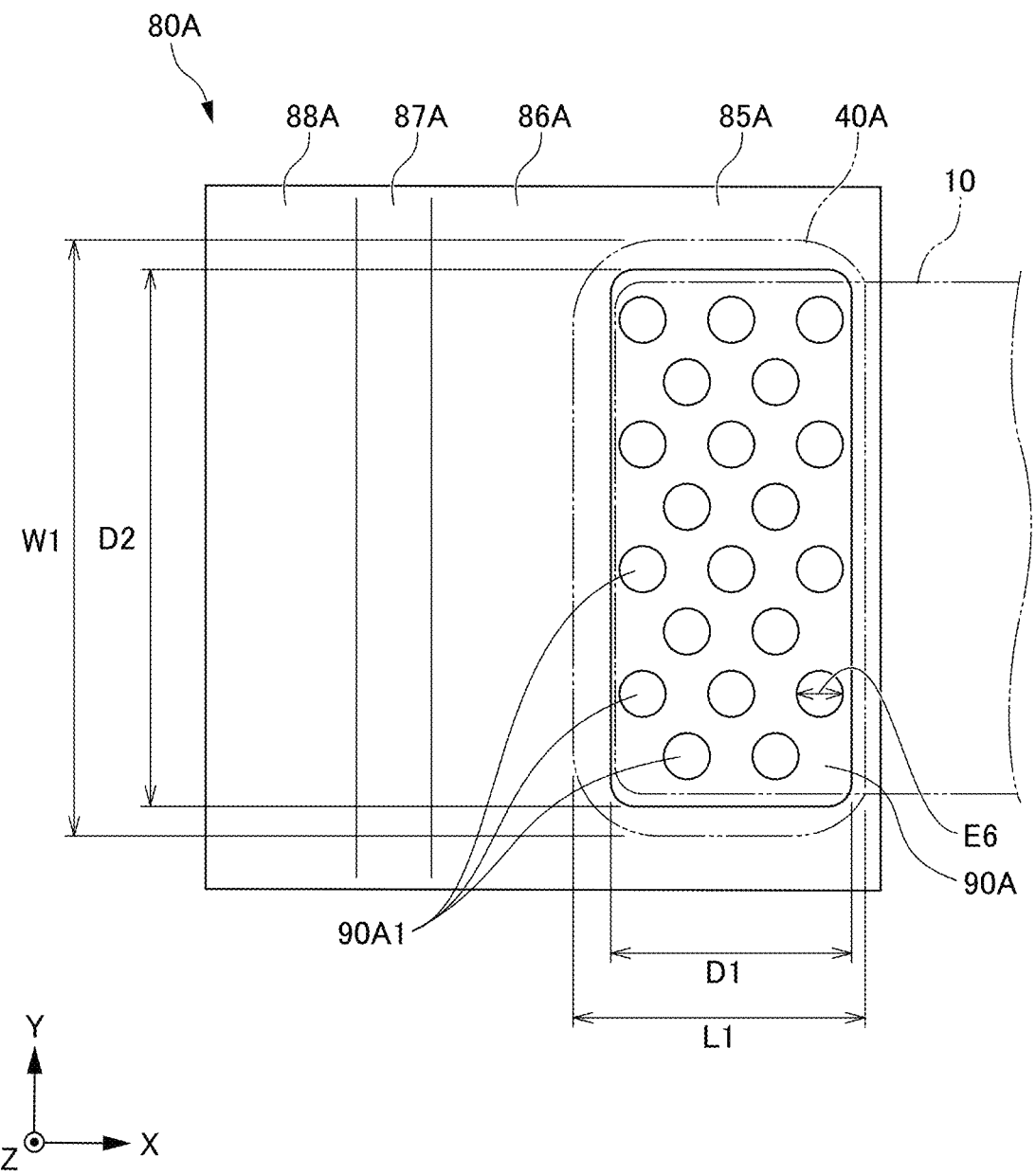
FIG. 13 is a diagram showing a first metal terminal according to a fourth modified example of the first preferred embodiment of the present invention, and is a diagram corresponding to FIG. 8.

Hereinafter, a description will be provided of a fourth modified example of the multilayer ceramic capacitor 1 of the present preferred embodiment. In the following description, the same or corresponding components as those of the above preferred embodiment are denoted by the same reference numerals, and detailed descriptions thereof are omitted. FIG. 13 is a diagram showing a first metal terminal 80A according to a fourth modified example of the present preferred embodiment, and is a diagram corresponding to FIG. 8.

In the present modified example, the structure of the first recess portion 90A provided in the first metal terminal 80A and the structure of the second recess portion 90B provided in the second metal terminal 80B differ from the structure of the above preferred embodiment.

As shown in FIG. 13, the first recess portion 90A of the present modified example includes a rectangular or substantially rectangular recess portion in a structure in which cylindrical column portions 90A1 remain.

It is preferable that the dimension D1 in the length direction L of the rectangular or substantially rectangular recess portion included in the first recess portion 90A is shorter than the length L1 in the length direction L of the first external electrode 40A. Furthermore, it is preferable that the dimension D2 in the width direction W of the rectangular or substantially rectangular recess portion included in the first recess portion 90A is shorter than the length W1 in the width direction W of the first external electrode 40A. As described above, it is preferable that the first recess portion 90A have a size hidden by the first external electrode 40A when viewed in the height direction T.

Although the diameter E6 of each of the cylindrical column portions 90A1 is not particularly limited, it is preferably about 10 μm or more and about 100 μm or less, for example. Thus, it is possible to position the multilayer ceramic capacitor main body 2 stably. Furthermore, it is possible to secure the electrically connected state between the first external electrode 40A of the multilayer ceramic capacitor main body 2 and the first metal terminal 80A. The column portions 90A1 are not limited to a cylindrical shape, and may be a prismatic shape, for example.

The mode of the second recess portion 90B provided in the second metal terminal 80B is the same as the mode of the first recess portion 90A provided in the first metal terminal 80A.

The structure of the first recess portion 90A provided in the first metal terminal 80A and the second recess portion 90B provided in the second metal terminal 80B in the present modified example still obtains the same advantageous effects as in the above preferred embodiment.

Figure 14:
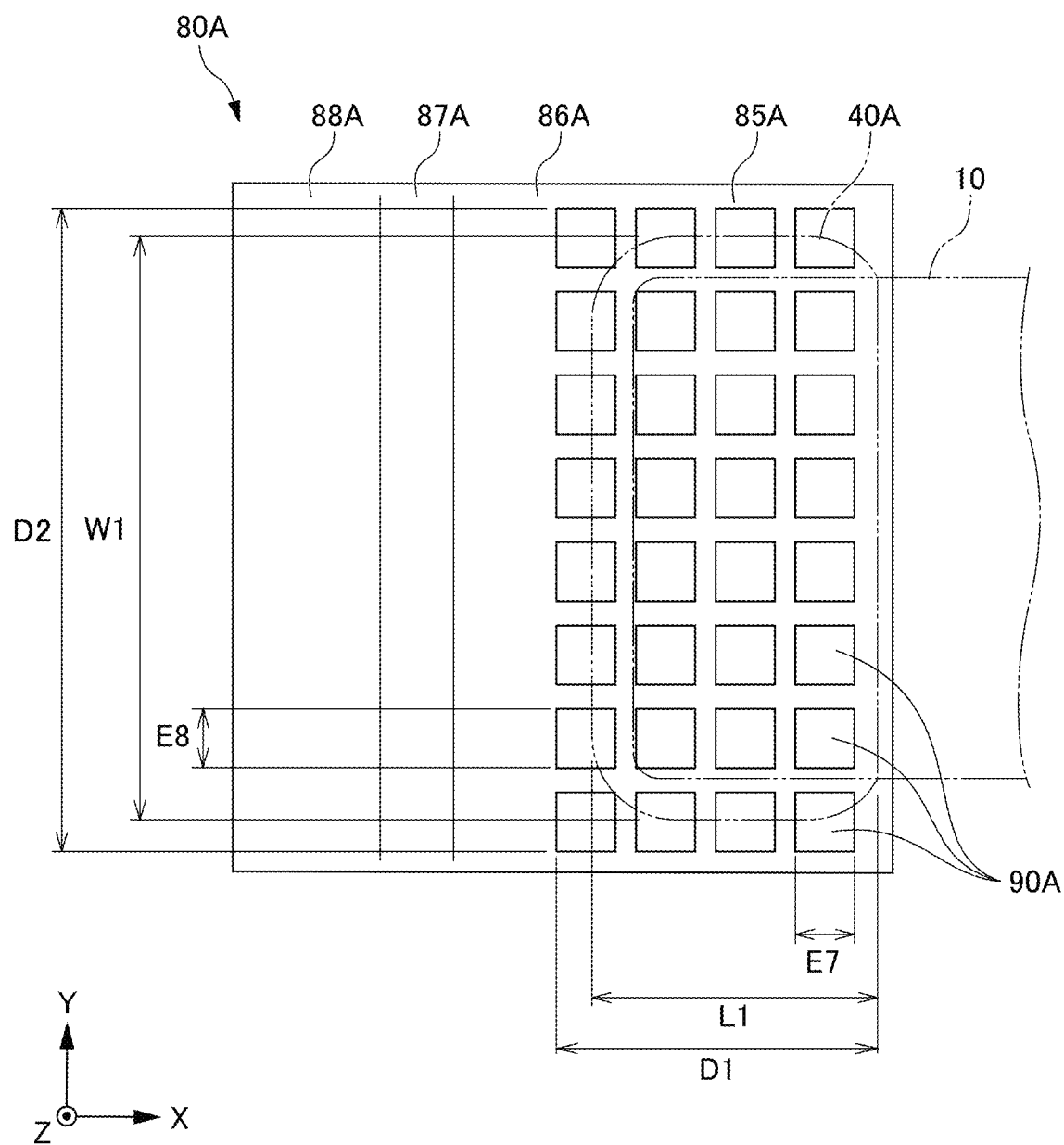
FIG. 14 is a diagram showing a first metal terminal according to a fifth modified example of the first preferred embodiment of the present invention, and is a diagram corresponding to FIG. 8.

Hereinafter, a description will be provided of a fifth modified example of the multilayer ceramic capacitor 1 of the present preferred embodiment. In the following description, the same or corresponding components as those of the above preferred embodiment are denoted by the same reference numerals, and detailed descriptions thereof are omitted. FIG. 14 is a diagram showing a first metal terminal 80A according to a fifth modified example of the present preferred embodiment, and is a diagram corresponding to FIG. 8.

In the present modified example, the structure of the first recess portion 90A provided in the first metal terminal 80A and the structure of the second recess portion 90B provided in the second metal terminal 80B differ from the structure of above preferred embodiment.

As shown in FIG. 14, the first recess portion 90A of the present modified example includes a plurality of rectangular or substantially rectangular recess portions positioned side by side in the direction of the length direction L and the width direction W. There is no particular limitation on the number of the plurality of recess portions included in the first recess portion 90A. However, in the present modified example, thirty-two square or substantially square recess portions are provided in the first bonding portion 85A.

It is preferable that the dimension D1 in the length direction L of the entire first recess portion 90A including the plurality of recess portions is shorter than the length L1 in the length direction L of the first external electrode 40A. However, it may be longer as shown in FIG. 14. Furthermore, it is preferable that the dimension D2 in the width direction W of the first recess portion 90A including the plurality of recess portions is shorter than the length W1 in the width direction W of the first external electrode 40A. However, it may be longer as shown in FIG. 14. In this case, the first recess portion 90A includes a portion that protrudes from the first external electrode 40A when viewed in the height direction T. It is preferable that the protruding portion is hidden by the wetted portion of the first bonding material 5A, such as solder, for example. However, there may be a portion which is not hidden by the wetted portion of the first bonding material 5A.

The dimension E7 in the length direction L and the dimension E8 in the width direction W of each of the plurality of recess portions included in the first recess portion 90A are preferably about 10 µm or more and about 100 µm or less, for example. It is preferable that at least one among the plurality of recess portions included in the first recess portion 90A have a size hidden by the first external electrode 40A when viewed in the height direction T.

The structure of the second recess portion 90B provided in the second metal terminal 80B is the same as the structure of the first recess portion 90A provided in the first metal terminal 80A.

The structure of the first recess portion 90A provided in the first metal terminal 80A and the second recess portion 90B provided in the second metal terminal 80B in the present modified example still obtains the same advantageous effects as in the above preferred embodiment.

According to the multilayer ceramic capacitor 1 of the exemplary preferred embodiments, the following advantageous effects are achieved.

(1) The multilayer ceramic electronic component 1 of the present preferred embodiment includes the multilayer ceramic electronic component main body 2 including the multilayer body 10, the first external electrode 40A, and the second external electrode 40B, the multilayer body including the plurality of laminated dielectric layers 20 and the plurality of laminated internal electrode layers 30, and further including the first main surface TS1 and the second main surface TS2 opposed to each other in the height direction, the first side surface WS1 and the second side surface WS2 opposed to each other in the width direction orthogonal or substantially orthogonal to the height direction, and the first end surface LS1 and the second end surface LS2 opposed to each other in the length direction orthogonal or substantially orthogonal to the height direction and the width direction, the first external electrode being provided in a vicinity of the first end surface LS1, and the second external electrode being provided in a vicinity of the second end surface LS2, the first metal terminal 80A connected to the first external electrode 40A via the bonding material 5, and the second metal terminal 80B connected to the second external electrode 40B via the bonding material 5, in which the first metal terminal 80A includes the first terminal main body 81A, and the first plating film 82A provided on a surface of the first terminal main body 81A, the second metal terminal 80B includes the second terminal main body 81B, and the second plating film 82B provided on a surface of the second terminal main body 81B, the first metal terminal 80A includes a surface connected to the first external electrode 40A on which the first recess portion 90A is provided such that the first terminal main body 81A is exposed, the second metal terminal 80B includes a surface connected to the second external electrode 40B on which the second recess portion 90B is provided such that the second terminal main body 81B is exposed, the first recess portion 90A and the second recess portion 90B each include cavities, and the exterior material 3 covers the multilayer ceramic electronic component main body 2, the bonding material 5, a portion of the first metal terminal 80A, and a portion of the second metal terminal 80B. The multilayer ceramic capacitor 1 as a finished product covered with the exterior material 3 is, thereafter, as a component, reflow mounted on a mounting board. At this time, there is a possibility that the bonding material 5 melts and the volume of the bonding material 5 expands. However, the bonding material 5 flows into the cavities of the first recess portion 90A and the second recess portion 90B, such that it is possible to reduce or prevent an increase in the internal pressure of the exterior material 3. Furthermore, by reducing or preventing an increase in the internal pressure of the exterior material 3, it is possible to reduce or prevent the generation of stress such that the resin included in the exterior material 3 is peeled off from the first metal terminal 80A and the second metal terminal 80B. Furthermore, it is possible to reduce or prevent the bonding material 5 from flowing out to the outside.

(2) The exterior material 3 of the present preferred embodiment is a thermosetting epoxy resin, for example. Thus, it is possible to ensure the adhesion between the exterior material 3, and the multilayer ceramic electronic component main body 2 and the metal terminal 80, and thus it is possible to obtain advantageous effects of improving the withstand voltage and moisture resistance performance.

(3) The first metal terminal 80A of the present preferred embodiment includes a first bonding portion 85A facing the first main surface TS1 or the second main surface TS2, or the first side surface WS1 or the second side surface WS2 on which the first external electrode 40A is provided, a first extending portion 86A connected to the first bonding portion 85A and extending away from the multilayer ceramic electronic component main body 2 in a direction parallel or substantially parallel to the first main surface TS1 or the second main surface TS2, or the first side surface WS1 or the second side surface WS2 facing the first bonding portion 85A, a second extending portion 87A connected to the first extending portion 86A and extending toward a mounting surface to provide a gap between the first main surface TS1 or the second main surface TS2, or the first side surface WS1 or the second side surface WS2 facing the first bonding portion 85A, and the mounting surface on which the multilayer ceramic electronic component 1 is to be mounted, and a first mounting portion 88A connected to the second extending portion 87A and extending parallel or substantially parallel to the mounting surface, and the second metal terminal 80B includes a second bonding portion 85B facing the first main surface TS1 or the second main surface TS2, or the first side surface WS1 or the second side surface WS2 on which the second external electrode 40B is provided, a third extending portion 86B connected to the second bonding portion 85B and extending away from the multilayer ceramic electronic component main body 2 in a direction parallel substantially parallel to the first main surface TS1 or the second main surface TS2, or the first side surface WS1 or the second side surface WS2 facing the second bonding portion 85B, a fourth extending portion 87B connected to the third extending portion 86B, and extending toward a mounting surface to provide a gap between the first main surface TS1 or the second main surface TS2, or the first side surface WS1 or the second side surface WS2 facing the second bonding portion 85B, and the mounting surface of a mounting board on which the multilayer ceramic electronic component 1 is to be mounted, and a second mounting portion 88B connected to the fourth extending portion 87B and extending parallel substantially parallel to the mounting surface. Thus, it is possible to increase the distance between the mounting board and the multilayer ceramic electronic component main body 2, and the advantageous effect of alleviating stress from the mounting board is obtained. Furthermore, it is possible to increase the thickness of the exterior material 3 provided in a vicinity of the mounting board, and thus it is possible to ensure insulation.

(4) In the multilayer ceramic electronic component 1 of the present preferred embodiment, molten bonding materials 5 flow into the first recess portion 90A and the second recess portion 90B, upon mounting the multilayer ceramic electronic component 1 on the mounting board 310 by reflow mounting, when the bonding material connecting the first external electrode 40A and the first metal terminal 80A and the bonding material connecting the second external electrode 40B and the second metal terminal 80B are melted. As a result, the advantageous effects of the above-described (1) can be obtained.

(5) The mounting structure 300 of the multilayer ceramic electronic component of the present preferred embodiment includes the multilayer ceramic electronic component 1, and the mounting board, in which the cavities provided in the first recess portion 90A and the second recess portion 90B include the bonding materials which are melted and flow thereinto upon mounting the multilayer ceramic electronic component 1 to the mounting board 310 by reflow mounting. As a result, the advantageous effects of the above-described (1) can be obtained.

Second Preferred Embodiment

Figure 15:
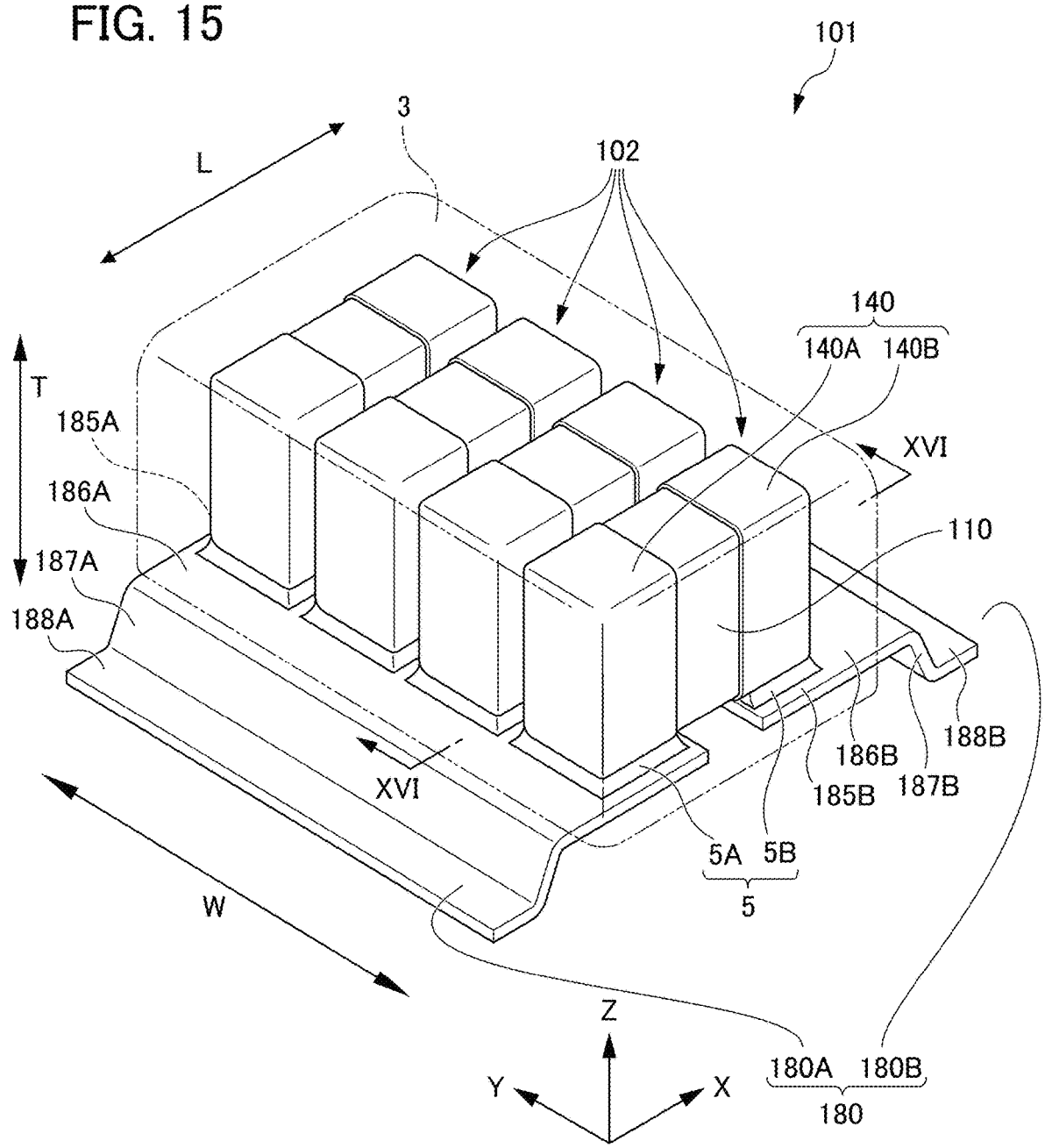
FIG. 15 is an external perspective view of a multilayer ceramic capacitor of a second exemplary preferred embodiment of the present invention.
Figure 16:
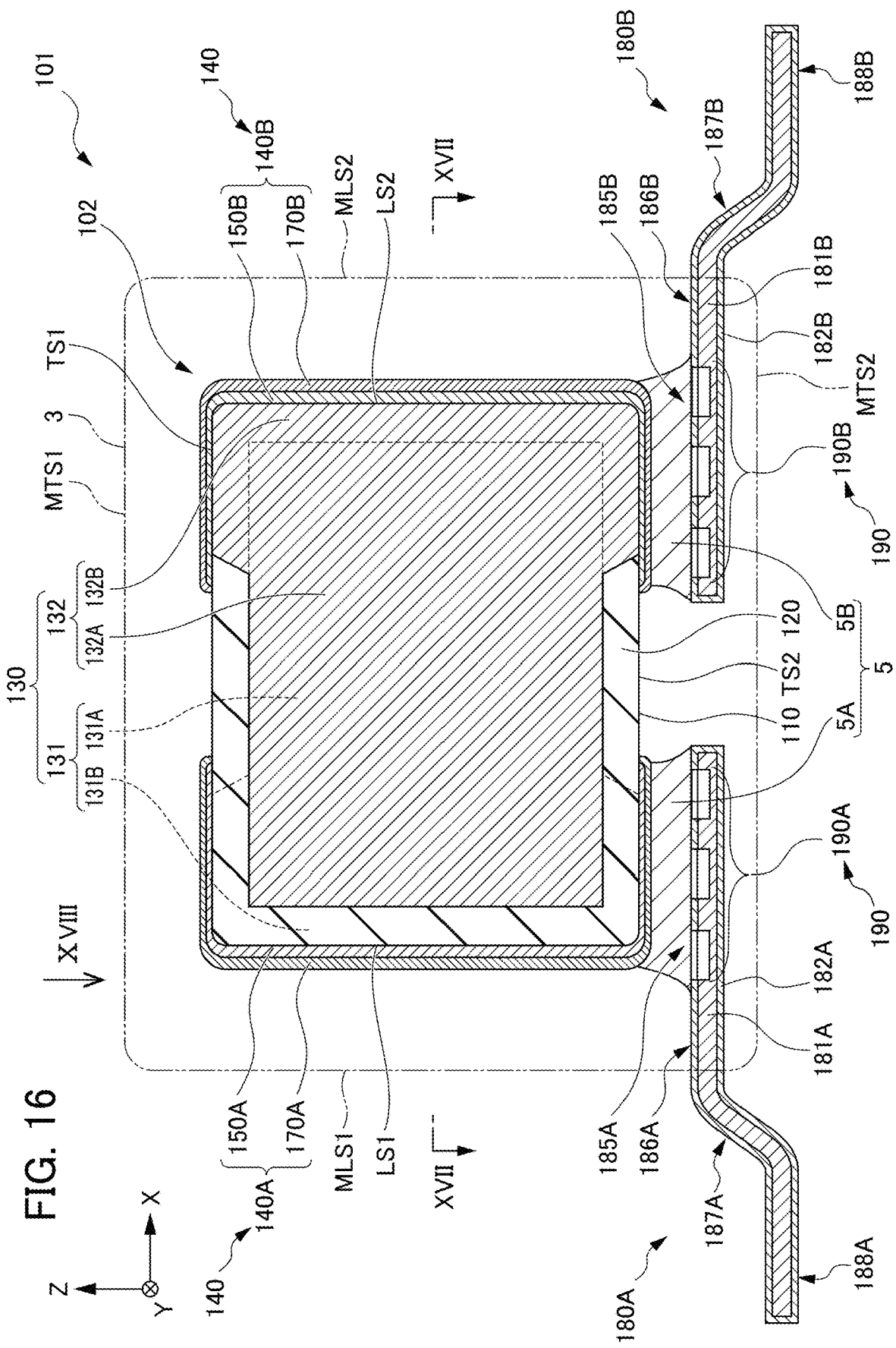
FIG. 16 is a cross-sectional view taken along the line XVI-XVI of the multilayer ceramic capacitor of FIG. 15.
Figure 17:
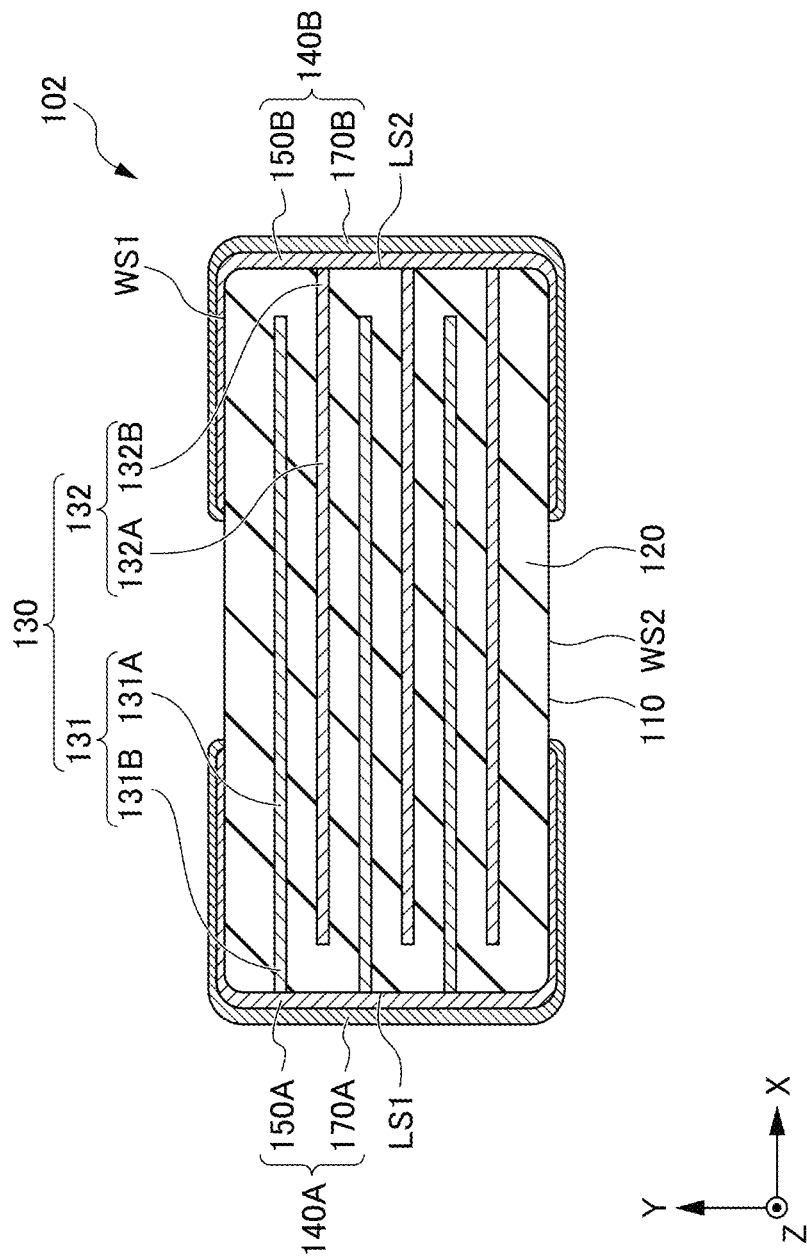
FIG. 17 is a cross-sectional view taken along the line XVII-XVII of the multilayer ceramic capacitor of FIG. 16.
Figure 18:
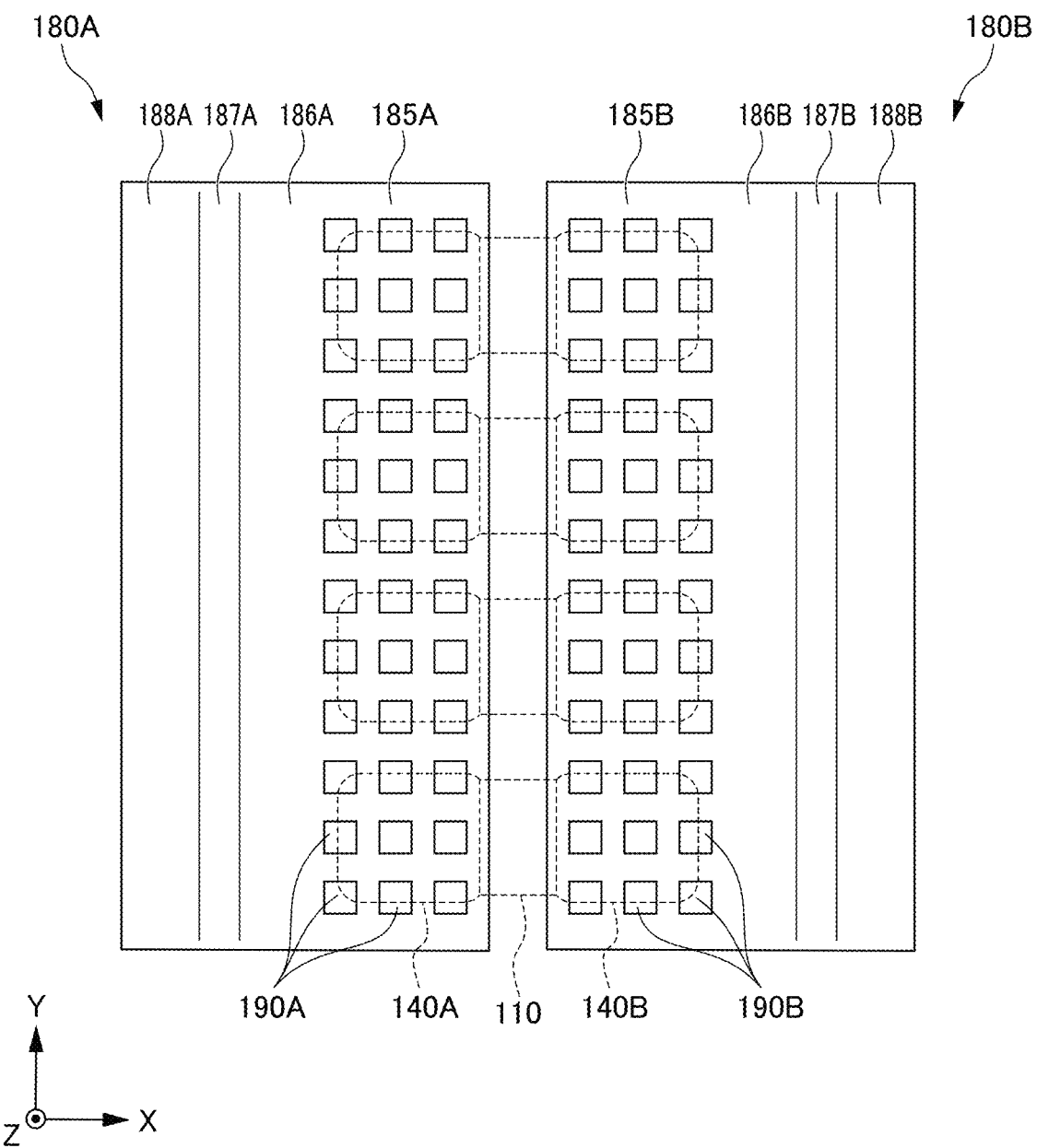
FIG. 18 is a view when a first metal terminal and a second metal terminal of the multilayer ceramic capacitor of FIG. 16 are viewed in the direction of the arrow XVIII.

Hereinafter, a multilayer ceramic capacitor 101 according to a second exemplary preferred embodiment of the present invention will be described. In the following description, the same or corresponding components as those of the first preferred embodiment are denoted by the same reference numerals, and detailed descriptions thereof are omitted. FIGS. 15 to 18 are diagrams for explaining the multilayer ceramic capacitor 101 of the present preferred embodiment. FIG. 15 is an external perspective view of the multilayer ceramic capacitor 101 of the present preferred embodiment. FIG. 16 is a cross-sectional view taken along the line XVI-XVI of the multilayer ceramic capacitor 101 of FIG. 15. FIG. 17 is a cross-sectional view taken along the line XVII-XVII of the multilayer ceramic capacitor 101 of FIG. 16. FIG. 18 is an arrow view when a first metal terminal 180A and a second metal terminal 180B of the multilayer ceramic capacitor 101 of FIG. 16 are viewed in the direction of the arrow XVIII.

In the first preferred embodiment, one multilayer ceramic capacitor main body 2 is covered with the exterior material 3, such that the multilayer ceramic capacitor 1 is provided. In the present preferred embodiment, a plurality of multilayer ceramic capacitor main bodies 102 as a plurality of multilayer ceramic electronic component bodies are covered with an exterior material 3, such that the multilayer ceramic capacitor 101 as a multilayer ceramic electronic component is provided.

The multilayer ceramic capacitor 101 of the present preferred embodiment includes the plurality of multilayer ceramic capacitor main body 102, and metal terminals 180 including recess portions 190 respectively provided therein. In the present preferred embodiment, as shown in FIG. 15, four multilayer ceramic capacitor main body 102 are positioned side by side in the width direction W.

As shown in FIGS. 15 and 16, the exterior material 3 covers the plurality of multilayer ceramic capacitor main bodies 102, bonding materials 5 to connect the multilayer ceramic capacitor main bodies 102 and the metal terminals 180, and a portion of each of the metal terminals 180. In FIGS. 15 and 16, the outline of the exterior material 3 is indicated by a two-dot chain line. FIG. 15 is a virtual view when viewed inside the exterior material 3 through the exterior material 3, and illustrates the plurality of multilayer ceramic capacitor main bodies 102 inside the exterior material 3, and the metal terminals 180.

The multilayer ceramic capacitor main body 102 of the present preferred embodiment includes a multilayer body 110 and external electrodes 140.

As shown in FIGS. 16 and 17, the multilayer body 110 includes a plurality of laminated dielectric layers 120 and a plurality of laminated internal electrode layers 130, and further includes a first main surface TS1 and a second main surface TS2 opposed to each other in the height direction, a first side surface WS1 and a second side surface WS2 opposed to each other in the width direction orthogonal or substantially orthogonal to the height direction, and a first end surface LS1 and a second end surface LS2 opposed to each other in the length direction orthogonal or substantially orthogonal to the height direction and the width direction.

The plurality of internal electrode layers 130 include a plurality of first internal electrode layers 131 and a plurality of second internal electrode layers 132. The plurality of first internal electrode layers 131 are provided on the plurality of dielectric layers 120. The plurality of second internal electrode layers 132 are provided on the plurality of dielectric layers 120. The plurality of first internal electrode layers 131 and the plurality of second internal electrode layer 132 are embedded so as to be alternately provided in the width direction W of the multilayer body 110. That is, unlike the multilayer body 10 of the first preferred embodiment, the plurality of dielectric layers 120 and the plurality of internal electrode layers 130 are laminated in the width direction W in the multilayer body 110 of the present preferred embodiment.

The first internal electrode layers 131 include first opposing portions 131A each facing the second internal electrode layer 132, and first lead-out portions 131B extending from the first opposing portions 131A to the first end surface LS1, and a portion of the first main surface TS1 and a portion of the second main surface TS2, respectively. The first lead-out portions 131B are exposed at the first end surface LS1, and a portion of the first main surface TS1 and a portion of the second main surface TS2, respectively.

The second internal electrode layers 132 include second opposing portions 132A each facing the first internal electrode layer 131, and second lead-out portions 132B extending from the second opposing portions 132A to the second end surface LS2, and a portion of the first main surface TS1 and a portion of the second main surface TS2, respectively. The second lead-out portions 132B are exposed at the second end surface LS2, and a portion of the first main surface TS1 and a portion of the second main surface TS2, respectively.

In the present preferred embodiment, the first opposing portion 131A and the second opposing portion 132A are opposed to each other with the dielectric layers 120 interposed therebetween, such that a capacitance is generated, and thus the characteristics of a capacitor are provided.

The external electrodes 140 include a first external electrode 140A and a second external electrode 140B.

The first external electrode 140A is provided on the first end surface LS1. The first external electrode 140A is connected to the first internal electrode layer 131. The first external electrode 140A extends onto the first end surface LS1, and at least a portion of the first main surface TS1 and a portion of the second main surface TS2. In the present preferred embodiment, the first external electrode 140A is provided on a portion of the first main surface TS1, a portion of the second main surface TS2, a portion of the first side surface WS1, and a portion of the second side surface WS2, in addition to the first end surface LS1.

The second external electrode 140B is provided on the second end surface LS2. The second external electrode 140B is connected to the second internal electrode layer 132. The second external electrode 140B extends onto the second end surface LS2, and at least a portion of the first main surface TS1 and a portion of the second main surface TS2. In the present preferred embodiment, the second external electrodes 140B are provided on a portion of the first main surface TS1, a portion of the second main surface TS2, a portion of the first side surface WS1, and a portion of the second side surface WS2, in addition to the second end surface LS2.

As in the first preferred embodiment, the first external electrode 140A preferably includes a first base electrode layer 150A and a first plated layer 170A provided on the first base electrode layer 150A.

As in the first preferred embodiment, the second external electrode 140B preferably includes a second base electrode layer 150B and a second plated layer 170B provided on the second base electrode layer 150B.

The metal terminals 180 include the first metal terminal 180A, and the second metal terminal 180B. The recess portions 190 provided in the metal terminals 180 include a first recess portion 190A provided in the first metal terminal 180A, and a second recess portion 190B provided in the second metal terminal 180B. The bonding materials 5 include a first bonding material 5A and a second bonding material 5B. The first metal terminal 180A is connected to the first external electrode 140A via the first bonding material 5A. The second metal terminal 180B is connected to the second external electrode 140B via the second bonding material 5B.

The first metal terminal 180A and the second metal terminal 180B are each a terminal to surface-mount the plurality of multilayer ceramic capacitor main body 102 on the mounting board. The first metal terminal 180A and the second metal terminal 180B are, for example, a plate-shaped lead frame, respectively.

The first metal terminal 180A includes a first bonding portion 185A facing the first main surface TS1 or the second main surface TS2, or the first side surface WS1 or the second side surface WS2 on which the first external electrode 140A is provided, a first extending portion 186A connected to the first bonding portion 185A and extending away from the multilayer ceramic capacitor main body 102 in a direction parallel or substantially parallel to the first main surface TS1 or the second main surface TS2, or the first side surface WS1 or the second side surface WS2 facing the first bonding portion 185A, a second extending portion 187A connected to the first extending portion 186A and extending toward a mounting surface to provide a gap between the first main surface TS1 or the second main surface TS2, or the first side surface WS1 or the second side surface WS2 facing the first bonding portion 185A, and the mounting surface on which the multilayer ceramic capacitor 101 is to be mounted, and a first mounting portion 188A connected to the second extending portion 187A and extending parallel or substantially parallel to the mounting surface. In the present preferred embodiment, the surface of the multilayer body 110 facing the first bonding portion 185A corresponds to the second main surface TS2.

The second metal terminal 180B includes a second bonding portion 185B facing the first main surface TS1 or the second main surface TS2, or the first side surface WS1 or the second side surface WS2 on which the second external electrode 140B is provided, a third extending portion 186B connected to the second bonding portion 185B and extending away from the multilayer ceramic capacitor main body 102 in a direction parallel or substantially parallel to the first main surface TS1 or the second main surface TS2, or the first side surface WS1 or the second side surface WS2 facing the second bonding portion 185B, a fourth extending portion 187B connected to the third extending portion 186B, and extending toward a mounting surface to provide a gap between the first main surface TS1 or the second main surface TS2, or the first side surface WS1 or the second side surface WS2 facing the second bonding portion 185B, and the mounting surface of a mounting board on which the multilayer ceramic capacitor 101 is to be mounted, and a second mounting portion 188B connected to the fourth extending portion 187B and extending parallel or substantially parallel to the mounting surface. In the present preferred embodiment, the surface of the multilayer body 110 facing the second bonding portion 185B corresponds to the second main surface TS2.

As shown in FIG. 16, the first metal terminal 180A includes a first terminal main body 181A and a first plating film 182A provided on the first terminal main body 181A. The first recess portion 190A is provided on a surface of the first metal terminal 180A connected to the first external electrode 140A so that the first terminal main body 181A is exposed.

As shown in FIG. 16, the second metal terminal 180B includes a second terminal main body 181B, and a second plating film 182B provided on the surface of the second terminal main body 181B. The second recess portion 190B is provided on a surface of the second metal terminal 180B connected to the second external electrode 140B so that the second terminal main body 181B is exposed.

The first recess portion 190A provided in the first metal terminal 180A includes cavities. The first recess portion 190A exposes the first terminal main body 181A. That is, a surface in the first recess portion 190A includes a surface to which the first plating film 182A is not applied. Therefore, when the first external electrodes 140A and the first metal terminal 180A are bonded to each other by the first bonding material 5A, the first bonding material 5A hardly flows into the first recess portion 190A.

The second recess portion 190B provided in the second metal terminal 180B includes cavities. The second recess portion 190B exposes the second terminal main body 181B. That is, a surface in the second recess portion 190B includes a surface to which the second plating film 182B is not applied. Therefore, when the second external electrode 140B and the second metal terminal 180B are bonded to each other by the second bonding material 5B, the second bonding material 5B hardly flows into the second recess portion 190B.

Next, the first recess portion 190A provided in the first metal terminal 180A, and the second recess portion 190B provided in the second metal terminal 180B will be described as an example. The recess portions 190 shown in FIG. 18 are a modified example of the recess portions shown in FIG. 14, and include an increased number of recess portions. With such a configuration, it is possible to connect the plurality of multilayer ceramic capacitor main bodies 102 to a pair of the first metal terminal 180A and the second metal terminal 180B.

FIG. 18 is a view when the first metal terminal 180A and the second metal terminal 180B of the multilayer ceramic capacitor 101 of FIG. 16 are viewed in the direction of the arrow XVIII, and shows an example of the first recess portion 190A and the second recess portion 190B. FIG. 18 shows an example of the first metal terminal 180A and the second metal terminal 180B before the multilayer ceramic capacitor main bodies 102 are connected thereto. It should be noted that FIG. 18 illustrates outline shapes of the multilayer body 110 and the external electrodes 140 when the plurality of multilayer ceramic capacitor main bodies 102 are connected to the first metal terminal 180A and the second metal terminal 180B by a two-dot chain line.

The first recess portion 190A of the present preferred embodiment includes a plurality of rectangular or substantially rectangular recess portions positioned side by side in the direction of the length direction L and the width direction W. There is no particular limitation on the number of the plurality of recess portions included in the first recess portion 190A, and in the present preferred embodiment, a large number of rectangular or substantially square recess portions are provided on a first bonding portion 185A.

The second recess portion 190B of the present preferred embodiment includes a plurality of rectangular or substantially rectangular recess portions positioned side by side in the direction of the length direction L and the width direction W. There is no particular limitation on the number of the plurality of recess portions included in the second recess portion 190B, and in the present preferred embodiment, a large number of rectangular or substantially square recess portions are provided on a second bonding portion 185B.

The structure of the recess portions including the first recess portion 190A and the second recess portion 190B is not limited thereto. For example, a pair of the first metal terminal 180A and the second metal terminal 180B may be provided with recess portions as shown in FIGS. 8 and 11 to 13. Also in this case, it is preferable to increase the number of recess portions in order to be able to connect the plurality of multilayer ceramic capacitor main bodies 102 thereto.

As described above, the multilayer ceramic electronic component 101 according to the present preferred embodiment includes the plurality of multilayer ceramic electronic component main bodies 102 including the multilayer body 110 including the plurality of laminated dielectric layers 120 and the plurality of laminated internal electrode layers 130, and external electrodes 140 each connected to the internal electrode layers 130, and the metal terminals 180 each connected to the external electrodes 140 of the plurality of multilayer ceramic electronic component main bodies 102 respectively with the bonding materials 5. The metal terminals 180 each include a terminal main body and a plating film provided on a surface of the terminal main body. The metal terminals 180 each includes a surface connected to the external electrode 140 on which the recess portion 190 is provided such that the terminal main body is exposed. The recess portion 190 includes cavities. The exterior material 3 covers the multilayer ceramic electronic component main body 102, the bonding materials 5, and at least a portion of each of the metal terminals 180. Even in such a configuration, the same advantageous effects as those of the first preferred embodiment can be obtained.

When the dimension in the length direction of the multilayer ceramic capacitor 101 including the exterior material 3 and the metal terminal 180 is defined as L, the dimension L is preferably about 3.2 mm or more and about 20 mm or less, for example. Furthermore, when the dimension in the lamination direction of the multilayer ceramic capacitor 101 is defined as T, the dimension T is preferably about 1.0 mm or more and about 10 mm or less, for example. Furthermore, when the dimension in the width direction of the multilayer ceramic capacitor 101 is defined as W, the dimension W is preferably about 1.5 mm or more and about 20 mm or less, for example.

According to the multilayer ceramic electronic component 101 of the present preferred embodiment, the following advantageous effects are obtained in addition to (1) to (5) of the first preferred embodiment.

(6) The multilayer ceramic electronic component 101 of the present preferred embodiment includes the plurality of multilayer ceramic electronic component main bodies 102, the first metal terminal 180A is connected to the first external electrode 140A of each of the plurality of multilayer ceramic electronic component main bodies 102 via the bonding material 5, and the second metal terminal 180B is connected to the second external electrode 140B of each of the plurality of multilayer ceramic electronic component main bodies 102 via the bonding material 5. Thus, even when including a plurality of multilayer ceramic electronic component bodies, it is still possible to reduce or prevent the generation of stress such that the exterior material 3 is peeled off from the metal terminal 180.

(7) The internal electrode layers 130 of the present preferred embodiment each include the first internal electrode layer 131 and the second internal electrode layer 132, the first internal electrode layer 131 includes the first opposing portion 131A facing the second internal electrode layer 132, and the first lead-out portion 131B extending to the first end surface LS1, and a portion of the first main surface TS1 and a portion of the second main surface TS2, respectively, the second internal electrode layer 132 includes the second opposing portion 132A facing the first internal electrode layer 131, and the second lead-out portion 132B extending to the second end surface LS2, and a portion of the first main surface TS1 and a portion of the second main surface TS2, respectively, and the first external electrode 140A extends to the first end surface LS1, and at least a portion of the first main surface TS1 and a portion of the second main surface TS2, and the second external electrode 140B extends to the second end surface LS2 and at least a portion of the first main surface TS1 and a portion of the second main surface TS2. With such a configuration, it is possible to increase the contact area between the internal electrode layers 130 and the external electrodes 140, such that it is possible to achieve low ESR and low thermal resistance.

Figure 19:
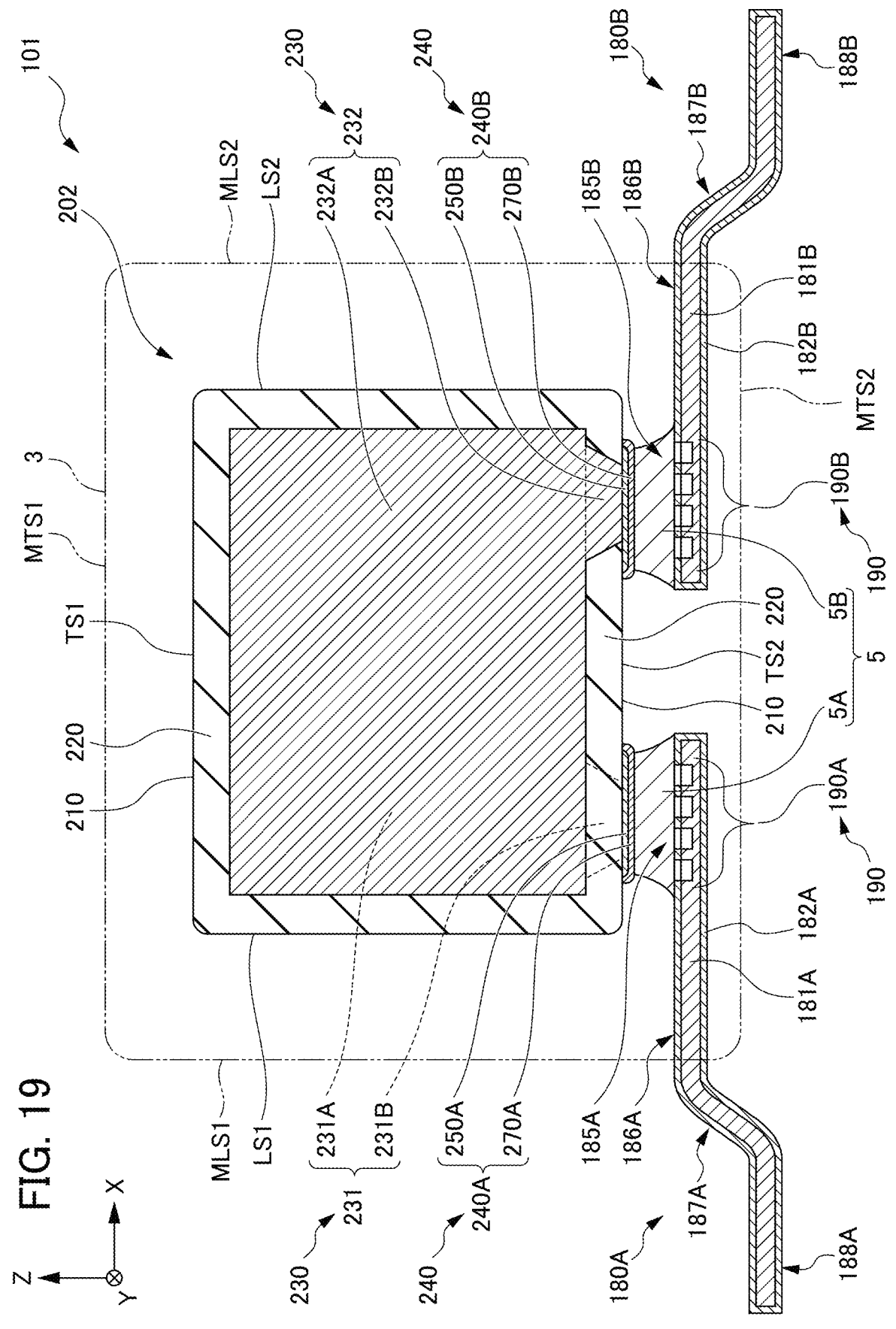

Hereinafter, a description will be provided of a modified example of the multilayer ceramic capacitor 101 of the present preferred embodiment. In the following description, the same or corresponding components as those of the above preferred embodiment are denoted by the same reference numerals, and detailed descriptions thereof are omitted. FIG. 19 is a cross-sectional view showing a modified example of the multilayer ceramic capacitor 101 of the present preferred embodiment, and is a diagram corresponding to FIG. 16.

In the present modified example, the configuration of a multilayer ceramic capacitor main body 202 is different from the above preferred embodiment.

The multilayer ceramic capacitor main body 202 of the modified example includes a multilayer body 210, and external electrodes 240.

The multilayer body 210 includes a plurality of laminated dielectric layers 220 and a plurality of laminated internal electrode layers 230.

The plurality of internal electrode layers 230 include a plurality of first internal electrode layers 231 and a plurality of second internal electrode layers 232. The plurality of first internal electrode layers 231 are provided on the plurality of dielectric layers 220. The plurality of second internal electrode layers 232 are provided on the plurality of dielectric layers 220. The plurality of first internal electrode layers 231 and the plurality of second internal electrode layers 232 are embedded so as to be alternately provided in the width direction W of the multilayer body 210. These configurations are the same or substantially the same as in the above preferred embodiment.

The first internal electrode layers 231 each include a first opposing portion 231A facing the second internal electrode layer 232, and a first lead-out portion 231B extending from the first opposing portion 231A to the second main surface TS2 in a vicinity of the first end surface LS1. The first lead-out portion 231B is exposed at the second main surface TS2 in a vicinity of the first end surface LS1.

The second internal electrode layer 232 includes a second opposing portion 232A facing the first internal electrode layer 231, and a second lead-out portion 232B extending from the second opposing portion 232A to the second main surface TS2 in a vicinity of the second end surface LS2. The second lead-out portion 232B is exposed at the second main surface TS2 in a vicinity of the second end surface LS2.

The external electrodes 240 include a first external electrode 240A and a second external electrode 240B.

The first external electrode 240A is provided on the second main surface TS2 in a vicinity of the first end surface LS1. The first external electrode 240A is connected to the first internal electrode layers 231.

The second external electrode 240B is provided on the second main surface TS2 in a vicinity of the second end surface LS2. The second external electrode 240B is connected to the second internal electrode layers 232.

The first external electrode 240A preferably includes a first base electrode layer 250A and a first plated layer 270A provided on the first base electrode layer 250A, similarly to the above preferred embodiment.

The second external electrode 240B preferably includes a second base electrode layer 250B and a second plated layer 270B provided on the second base electrode layer 250B, similarly to the above preferred embodiment.

The configuration of the metal terminals 180 is the same or substantially the same as that of the above preferred embodiment. The number and shape of the recess portions 190 are adjusted according to the size and shape of the external electrodes 240. Furthermore, the configuration of connecting the external electrodes 240 of the plurality of multilayer ceramic capacitor main body 202 with the metal terminals 180 via the bonding material 5 is the same or substantially the same as the above preferred embodiment. Even with such structure, the same advantageous effects as those of the above preferred embodiment can be obtained.

The configuration of the multilayer ceramic capacitor main body is not limited to the configurations shown in FIGS. 3 to 6, 16, and 19. For example, the multilayer ceramic capacitor main body may be multilayer ceramic capacitors with a two-part structure, a three-part structure, and a four-part structure as shown in FIGS. 20A, 20B, and 20C.

Figure 20A:
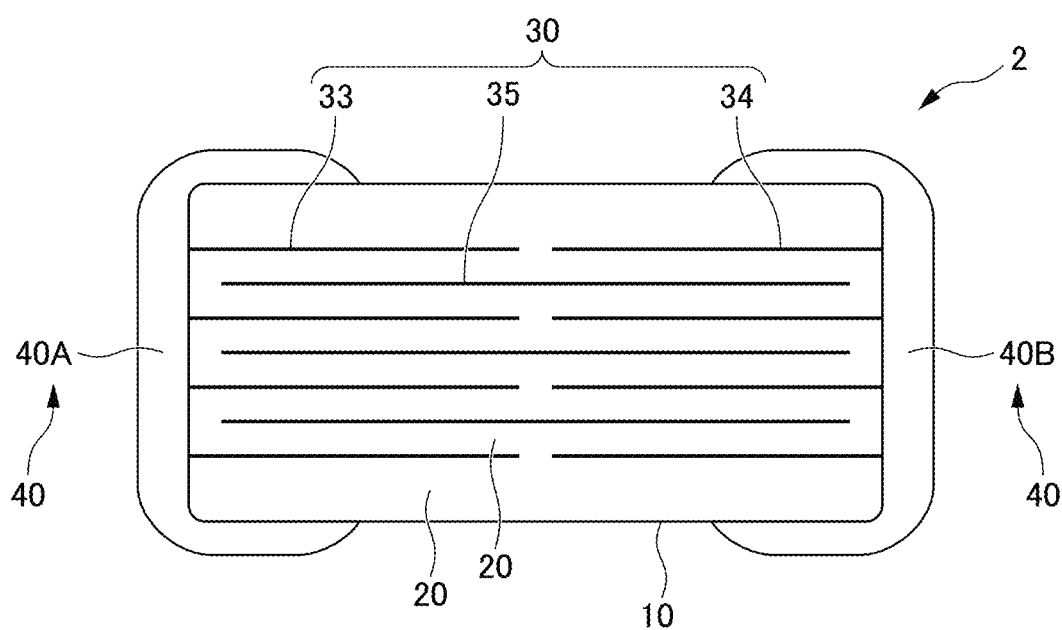
FIG. 20A is a diagram showing a multilayer ceramic capacitor with a two-part structure.
Figure 20B:
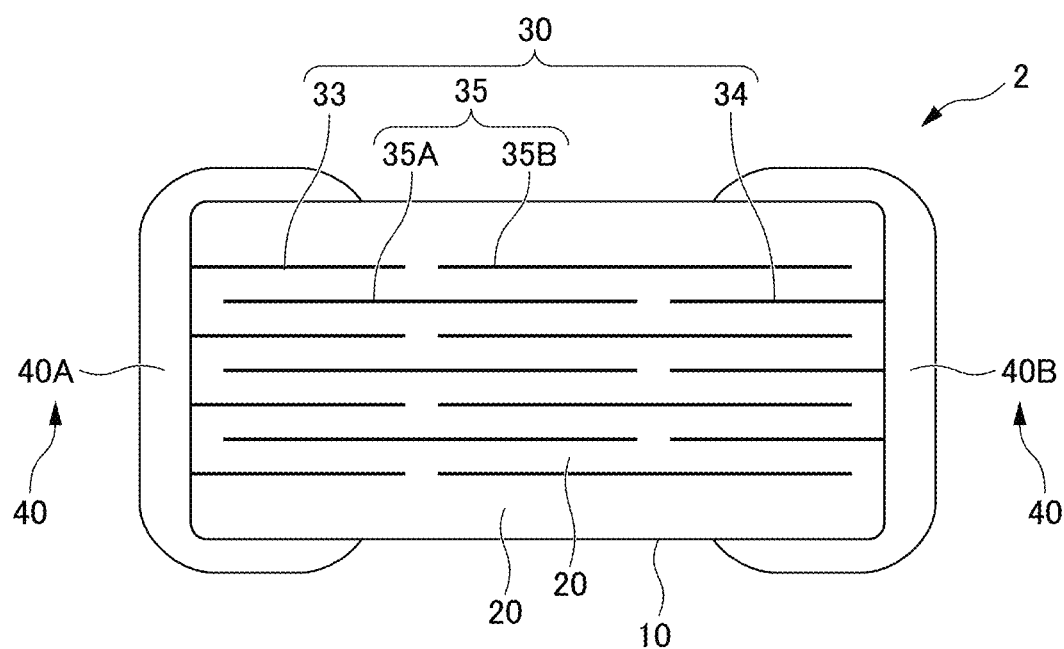
FIG. 20B is a diagram showing a multilayer ceramic capacitor with a three-part structure.
Figure 20C:
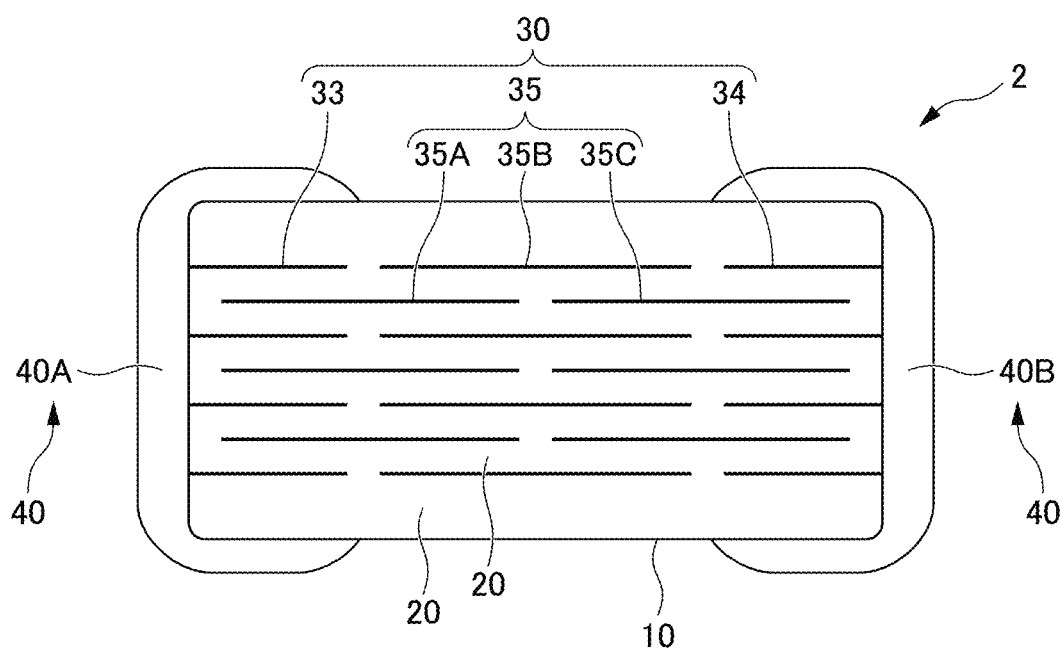
FIG. 20C is a diagram showing a multilayer ceramic capacitor with a four-part structure.

A multilayer ceramic capacitor main body 2 shown in FIG. 20A is a multilayer ceramic capacitor main body 2 including a two-part structure, and includes floating internal electrode layers 35, as the internal electrode layers 30, which do not extend to either of the first end surface LS1 or the second end surface LS2, in addition to the first internal electrode layer 33 and the second internal electrode layer 34. A multilayer ceramic capacitor main body 2 shown in FIG. 20B is a multilayer ceramic capacitor main body 2 including a three-part structure, and includes a first floating internal electrode layer 35A and a second floating internal electrode layer 35B as the floating internal electrode layers 35. A multilayer ceramic capacitor main body 2 shown in FIG. 20C is a multilayer ceramic capacitor main body 2 including a four-part structure, and includes, as the floating internal electrode layers 35, a first floating internal electrode layer 35A, a second floating internal electrode layer 35B, and a third floating internal electrode layer 35C. Thus, by providing the floating internal electrode layers 35 as the internal electrode layers 30, the multilayer ceramic capacitor main body 2 includes a plurality of divided opposing electrode portions. With such a configuration, a plurality of capacitor components are provided between the opposing internal electrode layers 30, thus providing a configuration in which these capacitor components are connected in series. Therefore, the voltage applied to the respective capacitor components is low, and thus, it is possible to achieve a high breakdown voltage of the multilayer ceramic capacitor main body 2. The multilayer ceramic capacitor main body 2 of the present preferred embodiment may also have a four or more-part structure.

The multilayer ceramic capacitor main body 2 may be of a two-terminal capacitor main body including two external electrodes, or may be a multi-terminal capacitor main body including a large number of external electrodes.

In the preferred embodiments described above, multilayer ceramic capacitors each including a dielectric ceramic have been exemplified as the multilayer ceramic electronic components. However, the multilayer ceramic electronic component of the present invention is not limited thereto, and is applicable to various multilayer ceramic electronic components such as, for example, piezoelectric components using a piezoelectric ceramic, thermistors using a semiconductor ceramic, and inductors using a magnetic ceramic. Examples of the piezoelectric ceramics include PZT (lead zirconate titanate) ceramics, examples of semiconductor ceramics include spinel ceramics, and examples of magnetic ceramics include ferrite.

The present invention is not limited to the configurations of the above-described preferred embodiments, and can be applied by appropriately modifying within a scope not changing the gist of the present invention. The present invention also encompasses combinations of two or more of the individual preferred configurations described in the above preferred embodiments.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer ceramic electronic component comprising:
a multilayer ceramic electronic component main body including a multilayer body, a first external electrode, and a second external electrode, the multilayer body including a plurality of laminated dielectric layers and a plurality of laminated internal electrode layers, and further including a first main surface and a second main surface opposed to each other in a height direction, a first side surface and a second side surface opposed to each other in a width direction orthogonal or substantially orthogonal to the height direction, and a first end surface and a second end surface opposed to each other in a length direction orthogonal or substantially orthogonal to the height direction and the width direction, the first external electrode being in a vicinity of the first end surface, and the second external electrode being in a vicinity of the second end surface;
a first metal terminal connected to the first external electrode via a bonding material; and
a second metal terminal connected to the second external electrode via a bonding material; wherein
the first metal terminal includes a first terminal main body, and a first plating film on a surface of the first terminal main body;
the second metal terminal includes a second terminal main body, and a second plating film on a surface of the second terminal main body;
the first metal terminal includes a surface connected to the first external electrode on which a first recess portion is provided such that the first terminal main body is exposed in the first recess portion;
the second metal terminal includes a surface connected to the second external electrode on which a second recess portion is provided such that the second terminal main body is exposed in the second recess portion;
the surface on which the first recess portion is provided faces the first external electrode;
the surface on which the second recess portion is provided faces the second external electrode;
the first recess portion and the second recess portion each include cavities;
an exterior material covers the multilayer ceramic electronic component main body, the bonding material, a portion of the first metal terminal, and a portion of the second metal terminal;
the first plating film is provided on a portion of the surface on which the first recess portion is provided; and
the second plating film is provided on a portion of the surface on which the second recess portion is provided.

2. The multilayer ceramic electronic component according to claim 1, wherein the exterior material is a thermosetting epoxy resin.

3. The multilayer ceramic electronic component according to claim 1, wherein
the first metal terminal includes:
a first bonding portion facing the first main surface or the second main surface, or the first side surface or the second side surface on which the first external electrode is provided;
a first extending portion connected to the first bonding portion, and extending away from the multilayer ceramic electronic component main body in a direction parallel or substantially parallel to the first main surface or the second main surface, or the first side surface or the second side surface facing the first bonding portion;
a second extending portion connected to the first extending portion, and extending toward a mounting surface to provide a gap between the first main surface or the second main surface, or the first side surface or the second side surface facing the first bonding portion, and the mounting surface of a mounting board on which the multilayer ceramic electronic component is to be mounted; and
a first mounting portion connected to the second extending portion, and extending parallel or substantially parallel to the mounting surface;
the second metal terminal includes:
a second bonding portion facing the first main surface or the second main surface, or the first side surface or the second side surface on which the second external electrode is provided;
a third extending portion connected to the second bonding portion, and extending away from the multilayer ceramic electronic component main body in a direction parallel or substantially parallel to the first main surface or the second main surface, or the first side surface or the second side surface facing the second bonding portion;
a fourth extending portion connected to the third extending portion, and extending toward the mounting surface to provide a gap between the first main surface or the second main surface, or the first side surface or the second side surface facing the second bonding portion, and the mounting surface of the mounting board on which the multilayer ceramic electronic component is to be mounted; and
a second mounting portion connected to the fourth extending portion, and extending parallel or substantially parallel to the mounting surface.

4. The multilayer ceramic electronic component according to claim 1, wherein
the multilayer ceramic electronic component includes a plurality of multilayer ceramic electronic component main bodies;
the first metal terminal is connected to a first external electrode of each of the plurality of multilayer ceramic electronic component main bodies via a bonding material; and
the second metal terminal is connected to the second external electrode of each of the plurality of multilayer ceramic electronic component main bodies via a bonding material.

5. The multilayer ceramic electronic component according to claim 1, wherein
the internal electrode layers each include a first internal electrode layer and a second internal electrode layer;
the first internal electrode layer includes a first opposing portion facing the second internal electrode layer, and a first lead-out portion extending to the first end surface, and a portion of the first main surface and a portion of the second main surface, respectively;
the second internal electrode layer includes a second opposing portion facing the first internal electrode layer, and a second lead-out portion extending to the second end surface, and a portion of the first main surface and a portion of the second main surface, respectively; and
the first external electrode extends to the first end surface, and at least a portion of the first main surface and a portion of the second main surface, and the second external electrode extends to the second end surface and at least a portion of the first main surface and a portion of the second main surface.

6. The multilayer ceramic electronic component according to claim 1, wherein molten bonding materials flow into the first recess portion and the second recess portion, upon mounting the multilayer ceramic electronic component on a mounting board by reflow mounting, when the bonding material connecting the first external electrode and the first metal terminal and the bonding material connecting the second external electrode and the second metal terminal are melted.

7. A mounting structure of a multilayer ceramic electronic component comprising:
the multilayer ceramic electronic component according to claim 1; and
a mounting board; wherein
the cavities in the first recess portion and the second recess portion include the bonding materials which are melted and flow thereinto upon mounting the multilayer ceramic electronic component to the mounting board by reflow mounting.

8. The mounting structure according to claim 7, wherein the exterior material is a thermosetting epoxy resin.

9. The mounting structure according to claim 7, wherein the first metal terminal includes:
a first bonding portion facing the first main surface or the second main surface, or the first side surface or the second side surface on which the first external electrode is provided;
a first extending portion connected to the first bonding portion, and extending away from the multilayer ceramic electronic component main body in a direction parallel or substantially parallel to the first main surface or the second main surface, or the first side surface or the second side surface facing the first bonding portion;
a second extending portion connected to the first extending portion, and extending toward a mounting surface to provide a gap between the first main surface or the second main surface, or the first side surface or the second side surface facing the first bonding portion, and the mounting surface of a mounting board on which the multilayer ceramic electronic component is to be mounted; and
a first mounting portion connected to the second extending portion, and extending parallel or substantially parallel to the mounting surface;

the second metal terminal includes:
a second bonding portion facing the first main surface or the second main surface, or the first side surface or the second side surface on which the second external electrode is provided;
a third extending portion connected to the second bonding portion, and extending away from the multilayer ceramic electronic component main body in a direction parallel or substantially parallel to the first main surface or the second main surface, or the first side surface or the second side surface facing the second bonding portion;
a fourth extending portion connected to the third extending portion, and extending toward the mounting surface to provide a gap between the first main surface or the second main surface, or the first side surface or the second side surface facing the second bonding portion, and the mounting surface of the mounting board on which the multilayer ceramic electronic component is to be mounted; and
a second mounting portion connected to the fourth extending portion, and extending parallel or substantially parallel to the mounting surface.

10. The mounting structure according to claim 7, wherein the multilayer ceramic electronic component includes a plurality of multilayer ceramic electronic component main bodies;
the first metal terminal is connected to a first external electrode of each of the plurality of multilayer ceramic electronic component main bodies via a bonding material; and
the second metal terminal is connected to the second external electrode of each of the plurality of multilayer ceramic electronic component main bodies via a bonding material.

11. The mounting structure according to claim 7, wherein
the internal electrode layers each include a first internal electrode layer and a second internal electrode layer;
the first internal electrode layer includes a first opposing portion facing the second internal electrode layer, and a first lead-out portion extending to the first end surface, and a portion of the first main surface and a portion of the second main surface, respectively;
the second internal electrode layer includes a second opposing portion facing the first internal electrode layer, and a second lead-out portion extending to the second end surface, and a portion of the first main surface and a portion of the second main surface, respectively; and
the first external electrode extends to the first end surface, and at least a portion of the first main surface and a portion of the second main surface, and the second external electrode extends to the second end surface and at least a portion of the first main surface and a portion of the second main surface.

12. The mounting structure according to claim 7, wherein each of the first and second recess portions includes a plurality of recess portions positioned side by side in the length direction.

13. The mounting structure according to claim 7, wherein each of the first and second recess portions includes a plurality of recess portions positioned side by side in the width direction.

14. The mounting structure according to claim 7, wherein each of the first and second recess portions is a grid-shaped recess portion including a plurality of recess portions positioned side by side in the length direction and a plurality of recess portions positioned side by side in the width direction and intersecting the plurality of recess portions positioned side by side in the length direction.

15. The mounting structure according to claim 7, wherein each of the first and second recess portions includes a plurality of rectangular or substantially rectangular recess portions positioned side by side in the length direction and the width direction.

16. The multilayer ceramic electronic component according to claim 1, wherein each of the first and second recess portions includes a plurality of recess portions positioned side by side in the length direction.

17. The multilayer ceramic electronic component according to claim 1, wherein each of the first and second recess portions includes a plurality of recess portions positioned side by side in the width direction.

18. The multilayer ceramic electronic component according to claim 1, wherein each of the first and second recess portions is a grid-shaped recess portion including a plurality of recess portions positioned side by side in the length direction and a plurality of recess portions positioned side by side in the width direction and intersecting the plurality of recess portions positioned side by side in the length direction.

19. The multilayer ceramic electronic component according to claim 1, wherein each of the first and second recess portions includes a plurality of rectangular or substantially rectangular recess portions positioned side by side in the length direction and the width direction.

\* \* \* \* \*